(12) United States Patent
Ishida

(10) Patent No.: US 12,494,616 B2
(45) Date of Patent: Dec. 9, 2025

(54) CONTROL METHOD OF DISCHARGE-EXCITATION TYPE LASER DEVICE, DISCHARGE-EXCITATION TYPE LASER DEVICE, AND ELECTRONIC DEVICE MANUFACTURING METHOD

(71) Applicant: Gigaphoton Inc., Tochigi (JP)

(72) Inventor: Keisuke Ishida, Oyama (JP)

(73) Assignee: Gigaphoton Inc., Tochigi (JP)

( * ) Notice: Subject to any disclaimer, the term of this patent is extended or adjusted under 35 U.S.C. 154(b) by 185 days.

(21) Appl. No.: 18/540,946

(22) Filed: Dec. 15, 2023

(65) Prior Publication Data

US 2024/0128706 A1 Apr. 18, 2024

Related U.S. Application Data

(63) Continuation of application No. PCT/JP2021/028219, filed on Jul. 29, 2021.

(51) Int. Cl.
*G03F 7/00* (2006.01)
*H01S 3/10* (2006.01)
(Continued)

(52) U.S. Cl.
CPC .......... *H01S 3/134* (2013.01); *G03F 7/70025* (2013.01); *H01S 3/10069* (2013.01); *H01S 3/139* (2013.01)

(58) Field of Classification Search
CPC .... G03F 7/20; G03F 7/70025; G03F 7/70041; G03F 7/70558; H01S 3/10069; H01S 3/134; H01S 3/136; H01S 3/139
See application file for complete search history.

(56) References Cited

U.S. PATENT DOCUMENTS 9,261,794 B1 2/2016 Ahlawat
2006/0072636 A1 4/2006 Jacques
(Continued)

FOREIGN PATENT DOCUMENTS

JP 10-173274 A 6/1998
JP 11-214782 A 8/1999
(Continued)

OTHER PUBLICATIONS

An Office Action; "Notice of Reasons for Refusal," mailed by the Japanese Patent Office on Mar. 11, 2025, which corresponds to Japanese Patent Application No. 2023-537875 and is related to U.S. Appl. No. 18/540,946; with English language translation.
(Continued)

*Primary Examiner* — Peter B Kim
(74) *Attorney, Agent, or Firm* — Studebaker Brackett PLLC

(57) ABSTRACT

A control method of a discharge-excitation type laser device including a power source configured to control a pulse energy of pulse laser light includes: during a first period, outputting the pulse laser light including a plurality of pulses from the discharge-excitation type laser device while periodically changing a wavelength; calculating correction data for correcting a voltage command value to be set to the power source in accordance with a change in the wavelength by using first time-series data of pulse energies of the plurality of pulses; and during a second period, acquiring the voltage command value, correcting the acquired voltage command value using the correction data, and outputting the pulse laser light from the discharge-excitation type laser device in accordance with the corrected voltage command value.

20 Claims, 16 Drawing Sheets

(51) Int. Cl.
    *H01S 3/134*    (2006.01)
    *H01S 3/139*    (2006.01)

(56)  References Cited

U.S. PATENT DOCUMENTS

| | | |
|---|---|---|
| 2009/0002666 A1 | 1/2009 | Tsuchiya |
| 2009/0067457 A1 | 3/2009 | Dunstan et al. |
| 2009/0147231 A1 | 6/2009 | Sukegawa |
| 2015/0168848 A1* | 6/2015 | Tanaka ................ G03F 7/70483 |
| | | 438/16 |
| 2018/0196347 A1* | 7/2018 | Minegishi ........... G03F 7/70575 |
| 2021/0294223 A1 | 9/2021 | Yamanaka et al. |

FOREIGN PATENT DOCUMENTS

| | | |
|---|---|---|
| JP | 2003-218437 A | 7/2003 |
| JP | 2008-515230 A | 5/2008 |
| JP | 2009-010231 A | 1/2009 |
| JP | 2009-141154 A | 6/2009 |
| JP | 2014-078765 A | 5/2014 |
| JP | 2019-032367 A | 2/2019 |
| WO | 2020/157839 A1 | 8/2020 |
| WO | 2021/126527 A1 | 6/2021 |

OTHER PUBLICATIONS

International Search Report issued in PCT/JP2021/028219; mailed Sep. 7, 2021.
International Preliminary Report On Patentability and Written Opinion issued in PCT/JP2021/028219; issued Jan. 18, 2024.

* cited by examiner

CONTROL METHOD OF DISCHARGE-EXCITATION TYPE LASER DEVICE, DISCHARGE-EXCITATION TYPE LASER DEVICE, AND ELECTRONIC DEVICE MANUFACTURING METHOD

CROSS-REFERENCE TO RELATED APPLICATIONS

The present application claims the benefit of International Application No. PCT/JP2021/028219, filed on Jul. 29, 2021, the entire contents of which are hereby incorporated by reference.

BACKGROUND

1. Technical Field

The present disclosure relates to a control method of a discharge-excitation type laser device, a discharge-excitation type laser device, and an electronic device manufacturing method.

2. Related Art

Recently, in a semiconductor exposure apparatus, improvement in resolution has been desired for miniaturization and high integration of semiconductor integrated circuits. For this purpose, an exposure light source that outputs light having a shorter wavelength has been developed. For example, as a gas laser device for exposure, a KrF excimer laser device for outputting laser light having a wavelength of about 248 nm and an ArF excimer laser device for outputting laser light having a wavelength of about 193 nm are used.

The KrF excimer laser device and the ArF excimer laser device each have a large spectral line width of about 350 to 400 pm in natural oscillation light. Therefore, when a projection lens is formed of a material that transmits ultraviolet rays such as KrF laser light and ArF laser light, there is a case in which chromatic aberration occurs. As a result, the resolution may decrease. Then, a spectral line width of laser light output from the gas laser device needs to be narrowed to the extent that the chromatic aberration can be ignored. For this purpose, there is a case in which a line narrowing module (LNM) including a line narrowing element (etalon, grating, and the like) is provided in a laser resonator of the gas laser device to narrow a spectral line width. In the following, a gas laser device with a narrowed spectral line width is referred to as a line narrowing laser device.

LIST OF DOCUMENTS

Patent Documents

Patent Document 1: Japanese Patent Application Publication No. 2003-218437
Patent Document 2: U.S. Pat. No. 9,261,794

SUMMARY

A control method of a discharge-excitation type laser device, according to an aspect of the present disclosure, including a power source configured to control a pulse energy of pulse laser light includes: during a first period, outputting the pulse laser light including a plurality of pulses from the discharge-excitation type laser device while periodically changing a wavelength; calculating correction data for correcting a voltage command value to be set to the power source in accordance with a change in the wavelength by using first time-series data of pulse energies of the plurality of pulses; and during a second period, acquiring the voltage command value, correcting the acquired voltage command value using the correction data, and outputting the pulse laser light from the discharge-excitation type laser device in accordance with the corrected voltage command value.

A discharge-excitation type laser device according to an aspect of the present disclosure includes a power source configured to control a pulse energy of pulse laser light; and a processor configured to control the power source. Here, the processor is configured, during a first period, to output the pulse laser light including a plurality of pulses from a discharge-excitation type laser device while periodically changing a wavelength, and calculate correction data for correcting a voltage command value to be set to the power source in accordance with a change in the wavelength by using first time-series data of pulse energies of the plurality of pulses, and during a second period, to acquire the voltage command value, correct the acquired voltage command value using the correction data, and output the pulse laser light from the discharge-excitation type laser device in accordance with the corrected voltage command value.

An electronic device manufacturing method according to an aspect of the present disclosure includes generating pulse laser light using a discharge-excitation type laser device, outputting the pulse laser light to an exposure apparatus, and exposing a photosensitive substrate to the pulse laser light in the exposure apparatus to manufacture an electronic device. Here, the discharge-excitation type laser device includes a power source configured to control a pulse energy of the pulse laser light; and a processor configured to control the power source. The processor is configured, during a first period, to output the pulse laser light including a plurality of pulses from a discharge-excitation type laser device while periodically changing a wavelength, and calculate correction data for correcting a voltage command value to be set to the power source in accordance with a change in the wavelength by using first time-series data of pulse energies of the plurality of pulses, and during a second period, to acquire the voltage command value, correct the acquired voltage command value using the correction data, and output the pulse laser light from the discharge-excitation type laser device in accordance with the corrected voltage command value.

BRIEF DESCRIPTION OF THE DRAWINGS

Embodiments of the present disclosure will be described below merely as examples with reference to the accompanying drawings.

DESCRIPTION OF EMBODIMENTS

Figure 1:
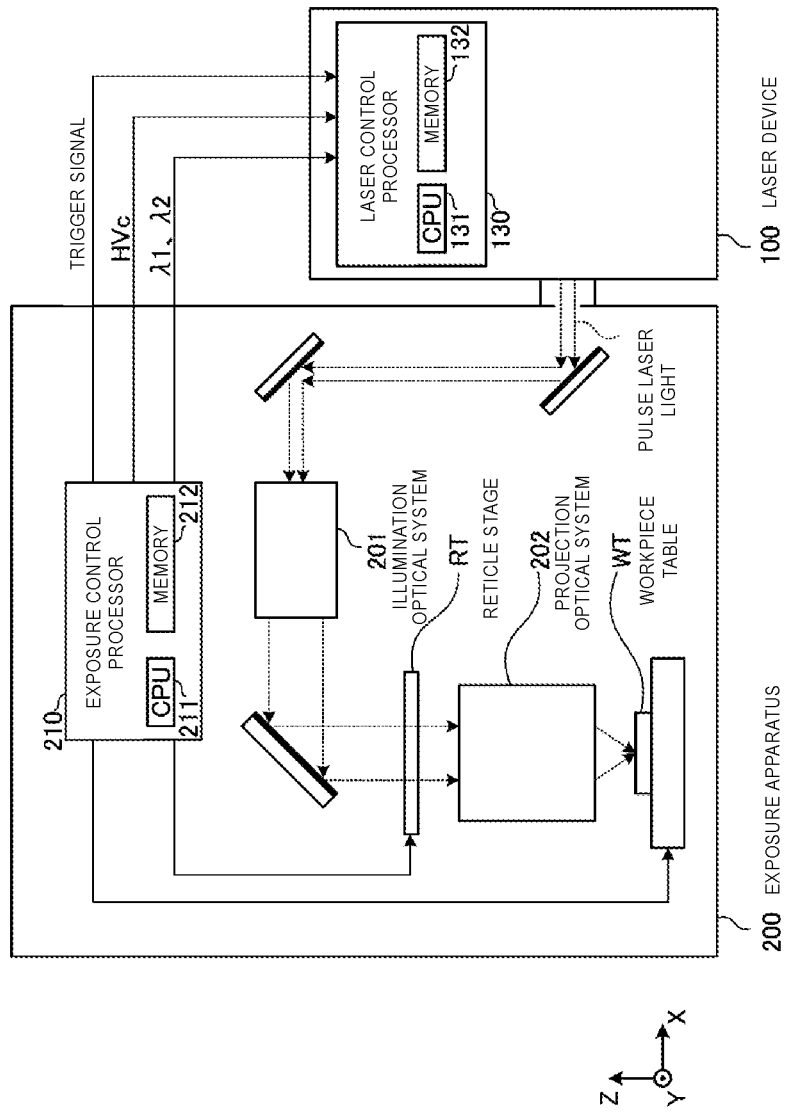
FIG. 1 schematically shows the configuration of an exposure system in a comparative example.

<Contents>
1. Comparative example
    1.1 Exposure system
        1.1.1 Configuration
        1.1.2 Operation
    1.2 Laser device 100
        1.2.1 Configuration
        1.2.2 Operation
    1.3 Line narrowing module 14
        1.3.1 Configuration
        1.3.2 Operation
    1.4 Step-and-scan exposure
    1.5 Example of periodic wavelength change
    1.6 Output control of pulse laser light
        1.6.1 Control by laser control processor 130
        1.6.2 Laser control by exposure control processor 210
    1.7 Problem of comparative example
2. Laser device which calculates correction data using time-series data of pulse energy En[ ]
    2.1 Configuration
    2.2 Control block diagram
    2.3 Output control of pulse laser light
    2.4 Update timing of voltage correction table 134
    2.5 Update processing of voltage correction table 134
    2.6 Effect
3. Laser device in which correction data is calculated further using time-series data of voltage command value HVc[ ]
    3.1 Update processing of voltage correction table 134
    3.2 Effect
4. Laser device in which Fourier transform is performed on time-series data of pulse energy En[ ] to calculate correction data
    4.1 Update processing of voltage correction table 134
    4.2 Effect
5. Laser device in which Fourier transform is performed on time-series data of voltage command value HVc[ ] to calculate correction data
    5.1 Update processing of voltage correction table 134
    5.2 Effect
6. Laser device in which correction data is calculated for each pulse number j in wavelength change period
    6.1 Update processing of voltage correction table 134
    6.2 Effect
7. Laser device in which voltage command value HVc is set based on target pulse energy Et
    7.1 Control by laser control processor 130
    7.2 Control by exposure control processor 210
8. Others
    8.1 Configuration of monitor module 17
    8.2 Operation of monitor module 17
    8.3 Supplement Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numeral, and duplicate description thereof is omitted.

1. Comparative Example 1.1 Exposure System

FIG. 1 schematically shows the configuration of an exposure system in a comparative example. The comparative example of the present disclosure is an example recognized by the applicant as known only by the applicant, and is not a publicly known example admitted by the applicant.

The exposure system includes a laser device 100 and an exposure apparatus 200. In FIG. 1, the laser device 100 is shown in a simplified manner.

The laser device 100 includes a laser control processor 130. The laser control processor 130 is a processing device including a memory 132 in which a control program is stored, and a central processing unit (CPU) 131 for executing the control program. The laser control processor 130 is specifically configured or programmed to perform various processes included in the present disclosure. The laser control processor 130 corresponds to the processor in the present disclosure. The laser device 100 is configured to output pulse laser light toward the exposure apparatus 200.

1.1.1 Configuration

As shown in FIG. 1, the exposure apparatus 200 includes an illumination optical system 201, a projection optical system 202, and an exposure control processor 210.

The illumination optical system 201 illuminates a reticle pattern of a reticle (not shown) arranged on a reticle stage RT with the pulse laser light incident from the laser device 100.

The projection optical system 202 causes the pulse laser light transmitted through the reticle to be imaged as being reduced and projected on a workpiece (not shown) arranged on a workpiece table WT. The workpiece is a photosensitive substrate such as a semiconductor wafer on which a resist film is applied.

The exposure control processor 210 is a processing device including a memory 212 in which a control program is stored and a CPU 211 for executing the control program. The exposure control processor 210 is specifically configured or programmed to perform various processes included in the present disclosure. The exposure control processor 210 performs overall control of the exposure apparatus 200.

1.1.2 Operation

The exposure control processor 210 transmits various parameters including target wavelengths 21, 22 and a voltage command value HVc, and a trigger signal to the laser control processor 130. The laser control processor 130 controls the laser device 100 in accordance with these parameters and signals. The target wavelengths $\lambda 1$, $\lambda 2$ are the target values of the wavelength, the target wavelength $\lambda 1$ corresponds to the first target wavelength in the present disclosure, and the target wavelength $\lambda 2$ corresponds to the second target wavelength in the present disclosure. The target wavelength $\lambda 1$ is a wavelength larger than the target wavelength $\lambda 2$.

The exposure control processor 210 synchronously translates the reticle stage RT and the workpiece table WT in opposite directions with each other. Thus, the workpiece is exposed to the pulse laser light reflecting the reticle pattern.

By such an exposure process, the reticle pattern is transferred onto the semiconductor wafer. Thereafter, an electronic device can be manufactured through a plurality of processes.

1.2 Laser Device 100

1.2.1 Configuration

Figure 2:
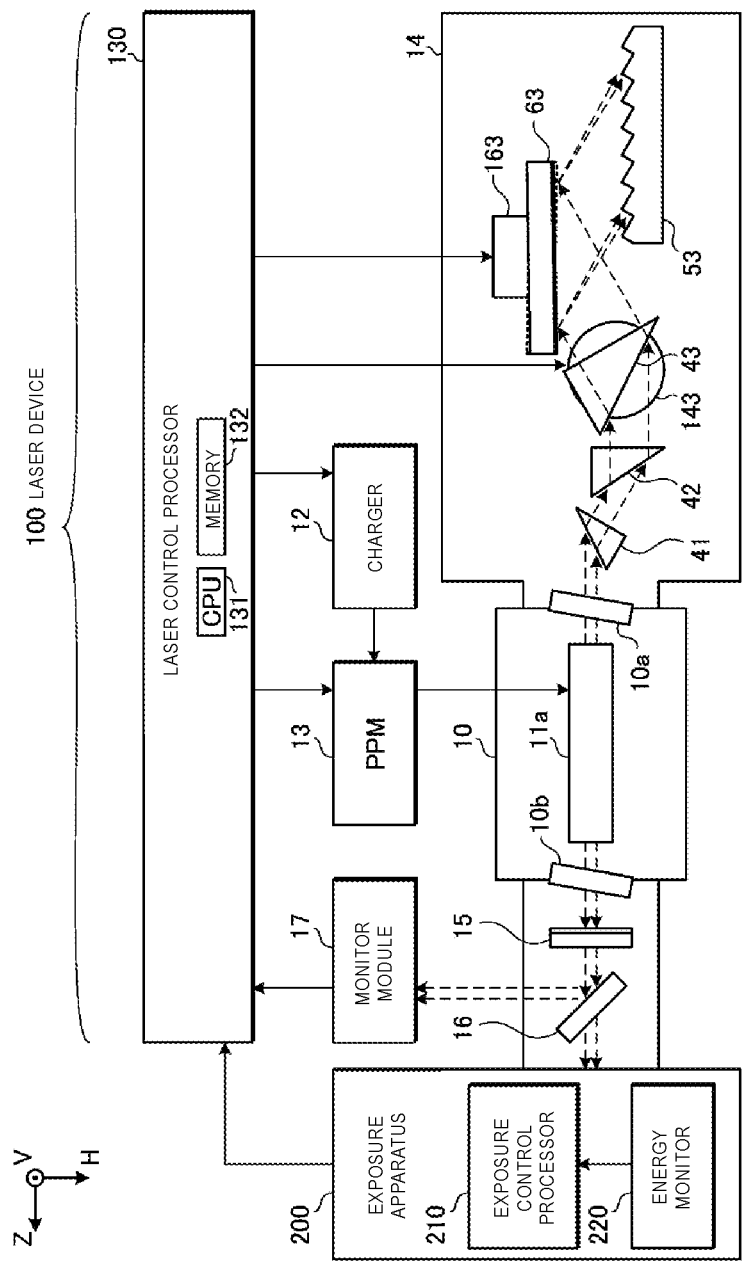
FIG. 2 schematically shows the configuration of a laser device in the comparative example.

FIG. 2 schematically shows the configuration of the laser device 100 in the comparative example. In FIG. 2, some components included in the exposure apparatus 200 are not shown.

The laser device 100 is a discharge-excitation type laser device, and includes, in addition to the laser control processor 130, a laser chamber 10, a charger 12, a pulse power module (PPM) 13, a line narrowing module 14, an output coupling mirror 15, and a monitor module 17. The line narrowing module 14 and the output coupling mirror 15 configure an optical resonator.

The laser chamber 10 is arranged on the optical path of the optical resonator. The laser chamber 10 is provided with two windows 10a, 10b.

The laser chamber 10 accommodates a discharge electrode 11a and a discharge electrode (not shown) paired with the discharge electrode 11a. The discharge electrode (not shown) is positioned to overlap with the discharge electrode 11a along a direction perpendicular to the paper surface of FIG. 2. The laser chamber 10 is filled with a laser gas containing, for example, an argon gas or a krypton gas as a rare gas, a fluorine gas as a halogen gas, a neon gas as a buffer gas, and the like.

The charger 12 holds electric energy to be supplied to the pulse power module 13. The pulse power module 13 includes a charging capacitor (not shown) and a switch (not shown). The charger 12 is connected to the charging capacitor. The charging capacitor is connected to the discharge electrode 11a. The charger 12 and the pulse power module 13 configure the power source of the present disclosure.

The line narrowing module 14 includes prisms 41 to 43, a grating, and a mirror 63. Details of the line narrowing module 14 will be described later.

The output coupling mirror 15 is configured by a partial reflection mirror.

A beam splitter 16 that transmits part of the pulse laser light at high transmittance and reflects the other part is arranged on the optical path of the pulse laser light output from the output coupling mirror 15. The monitor module 17 is arranged on the optical path of the pulse laser light reflected by the beam splitter 16. Details of the configuration of the monitor module 17 will be described later with reference to FIG. 26.

1.2.2 Operation

The laser control processor 130 acquires various parameters including the target wavelengths $\lambda 1$, $\lambda 2$ and the voltage command value HVc from the exposure control processor 210. The laser control processor 130 transmits a control signal to the line narrowing module 14 based on the target wavelengths $\lambda 1$, $\lambda 2$. The laser control processor 130 sets the acquired voltage command value HVc to the charger 12.

The laser control processor 130 receives the trigger signal from the exposure control processor 210. The laser control processor 130 transmits an oscillation trigger signal based on the trigger signal to the pulse power module 13. The switch included in the pulse power module 13 is turned on when the oscillation trigger signal is received from the laser control processor 130. When the switch is turned on, the pulse power module 13 generates a pulse high voltage from the electric energy charged in the charger, and applies the high voltage to the discharge electrode 11a.

When the high voltage is applied to the discharge electrode 11a, discharge occurs at a discharge space between the discharge electrode 11a and the discharge electrode (not shown). The laser gas in the laser chamber 10 is excited by the energy of the discharge and shifts to a high energy level. When the excited laser gas then shifts to a low energy level, light having a wavelength corresponding to the difference between the energy levels is emitted.

The light generated in the laser chamber 10 is output to the outside of the laser chamber 10 through the windows 10a, 10b. The light output from the window 10a enters the line narrowing module 14. Among the light having entered the line narrowing module 14, the light having a wavelength near a desired wavelength is turned back by the line narrowing module 14 and returned to the laser chamber 10.

The output coupling mirror 15 transmits and outputs, as pulse laser light, part of the light output from the window 10b, and reflects the other part back into the laser chamber 10.

In this way, the light output from the laser chamber 10 reciprocates between the line narrowing module 14 and the output coupling mirror 15. This light is amplified every time when passing through the discharge space in the laser chamber 10. Further, the light is line-narrowed every time when being turned back by the line narrowing module 14, and becomes light having a steep wavelength distribution with a part of a range of wavelength selected by the line narrowing module 14 as a center wavelength. Thus, the light having undergone laser oscillation and line narrowing is output as pulse laser light from the output coupling mirror 15. The wavelength of the pulse laser light refers to the center wavelength unless otherwise specified.

The monitor module 17 measures the wavelength of the pulse laser light and transmits the measured wavelength to the laser control processor 130. The laser control processor 130 controls the line narrowing module 14 based on the measured wavelength.

The pulse laser light transmitted through the beam splitter 16 enters the exposure apparatus 200. An energy monitor 220 included in the exposure apparatus 200 measures a pulse energy En of the pulse laser light. The exposure control processor 210 calculates the voltage command value HVc based on the pulse energy En and the target pulse energy Et, and transmits the voltage command value Hvc to the laser control processor 130. The pulse energy En of the pulse laser light is controlled by the voltage command value HVc.

1.3 Line Narrowing Module 14
1.3.1 Configuration

The prisms 41, 42, 43 are arranged in this order on the optical path of the light beam output from the window 10a. The prisms 41 to 43 are arranged such that the surfaces of the prisms 41 to 43 from which the light beams are incident and output are parallel to the V axis, and are respectively supported by holders (not shown). The prism 43 is rotatable about an axis parallel to the V axis by a rotation stage 143. Examples of the rotation stage 143 include a rotation stage including a stepping motor and having a large movable range.

The mirror 63 is arranged on the optical path of the light beam transmitted through the prisms 41 to 43. The mirror 63 is arranged such that the surface for reflecting the light beam is parallel to the V axis, and is rotatable about an axis parallel to the V axis by the rotation stage 163. Examples of the rotation stage 163 include a rotation stage including a piezoelectric element and having high responsiveness.

Alternatively, the prism 42 may be rotatable by the rotation stage 143, the prism 43 may be rotatable by the rotation stage 163, and the mirror 63 may not be rotated.

The grating 53 is arranged on the optical path of the light beam reflected by the mirror 63. The direction of the grooves of the grating 53 is parallel to the V axis.

The grating 53 is supported by a holder (not shown).
1.3.2 Operation

The travel direction of the light beam output from the window 10a is changed by each of the prisms 41 to 43 in a plane parallel to the HZ plane which is a plane perpendicular to the V axis, and the beam width is expanded in the plane parallel to the HZ plane.

The light beam transmitted through the prisms 41 to 43 is reflected by the mirror 63 and is incident on the grating 53.

The light beam incident on the grating 53 is reflected by a plurality of grooves of the grating 53 and is diffracted in a direction corresponding to the wavelength of the light. The grating 53 is arranged in the Littrow arrangement, which causes the incident angle of the light beam incident on the grating 53 from the mirror 63 to coincide with the diffraction angle of the diffracted light having the desired wavelength.

The mirror 63 reflects the light returned from the grating 53 toward the prism 43. The prisms 41 to 43 reduce the beam width of the light reflected by the mirror 63 in the plane parallel to the HZ plane and return the light into the laser chamber 10 through the window 10a.

The laser control processor 130 controls the rotation stages 143, 163 via a driver (not shown). In accordance with the rotation angles of the rotation stages 143, 163, the incident angle of the light beam incident on the grating 53 changes, and the wavelength selected by the line narrowing module 14 changes. The rotation stage 143 is mainly used for coarse adjustment, and the rotation stage 163 is mainly used for fine adjustment.

Based on the target wavelengths λ1, λ2 received from the exposure control processor 210, the laser control processor 130 controls the rotation stage 163 so that the posture of the mirror 63 periodically changes for every plurality of pulses. As a result, the wavelength of the pulse laser light periodically changes for every plurality of pulses. In this way, the laser device 100 can perform two-wavelength oscillation or multiple-wavelength oscillation.

The focal length in the exposure apparatus 200 depends on the wavelength of the pulse laser light. The pulse laser light entering the exposure apparatus 200 through two-wavelength oscillation or multiple-wavelength oscillation can be focused at a plurality of different positions in the direction of the optical path axis of the pulse laser light, and the focal depth can be substantially increased. For example, even when a resist film having a large thickness is exposed, the imaging performance in the thickness direction of the resist film can be maintained.

1.4 Step-and-Scan Exposure

Figure 3:
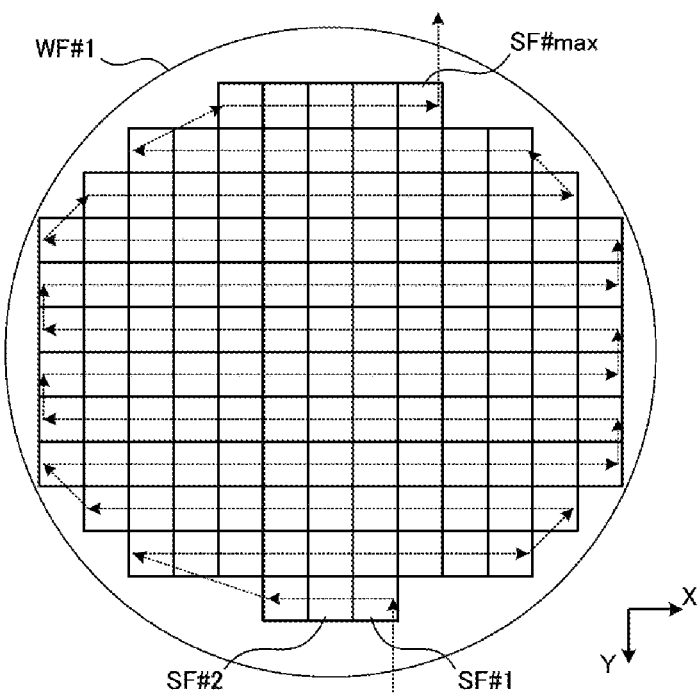
FIG. 3 shows an example of a semiconductor wafer exposed by the exposure system.

FIG. 3 shows an example of a semiconductor wafer WF #1 exposed by the exposure system. The semiconductor wafer WF #1 is, for example, a single crystal silicon plate having a substantially disk shape. For example, a photosensitive resist film is applied to the semiconductor wafer WF #1. Exposure of the semiconductor wafer WF #1 is performed for each section such as the scan field SF #1, SF #2, or the like. Each of the scan fields SF #1, SF #2 corresponds to an area where a reticle pattern of one reticle is transferred. The semiconductor wafer WF #1 is moved so that the first scan field SF #1 is irradiated with the pulse laser light, and exposure of the scan field SF #1 is performed. Thereafter, the semiconductor wafer WF #1 is moved so that the second scan field SF #2 is irradiated with the pulse laser light, and exposure of the scan field SF #2 is performed. Thereafter, the wafer WF #1 is moved in a similar manner to perform exposure up to the final scan field SF #max.

Figure 4:
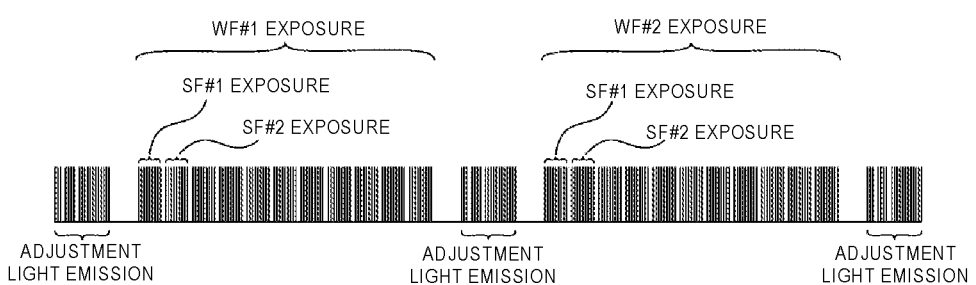
FIG. 4 shows an example of trigger signals transmitted from an exposure control processor to a laser control processor.

FIG. 4 shows an example of trigger signals transmitted from the exposure control processor 210 to the laser control processor 130. When one scan field SF #1 or SF #2 is to be exposed, the pulse laser light is continuously output at a predetermined repetition frequency. The continuous output of the pulse laser light at the predetermined repetition frequency is referred to as burst output. When moving from one scan field SF #1 to another scan field SF #2, the burst output of the pulse laser light is paused. Therefore, the burst output is repeated a plurality of times to perform exposure of one semiconductor wafer WF #1.

When exposure of the first semiconductor wafer WF #1 is completed, output of the pulse laser light to the exposure apparatus 200 is stopped to replace the semiconductor wafer WF #1 on the workpiece table WT with the second semiconductor wafer WF #2. However, in a state in which an optical shutter (not shown) is closed, adjustment light emission for the purpose of adjusting parameters or the like may be performed.

1.5 Example of Periodic Wavelength Change

Figure 5:
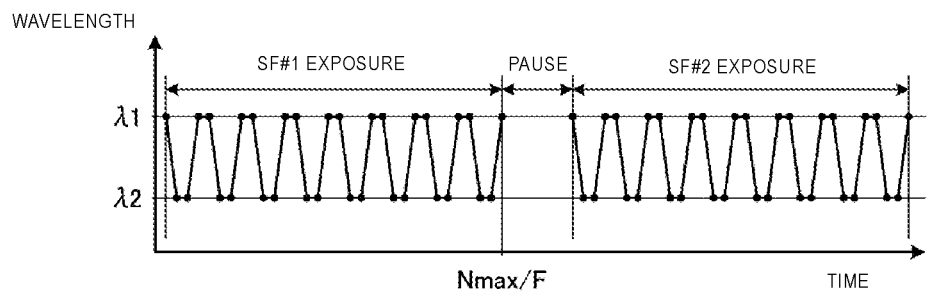
FIG. 5 is a graph showing an example of a periodic wavelength change.

FIG. 5 is a graph showing an example of a periodic wavelength change. In FIG. 5, the horizontal axis represents time and the vertical axis represents the wavelength.

The number of pulses of one burst output for exposure of one scan field SF #1 or SF #2 is defined as Nmax. When the repetition frequency of the pulse laser light is F, the required time of one burst output is Nmax/F.

In the example shown in FIG. 5, the wavelength periodically changes every 4 pulses between the target wavelengths $\lambda 1$ and $\lambda 2$. The wavelength of the first and fourth pulses of the pulse laser light is set to the target wavelength $\lambda 1$, and the wavelength of the second and third pulses of the pulse laser light is set to the target wavelength $\lambda 2$. Similarly thereafter, generation of 2 pulses at the target wavelength $\lambda 1$ and generation of 2 pulses at the target wavelength $\lambda 2$ are repeated. In this way, the laser device 100 outputs the pulse laser light including a plurality of pulses while periodically changing the wavelength.

1.6 Output Control of Pulse Laser Light
1.6.1 Control by Laser Control Processor 130

Figure 6:
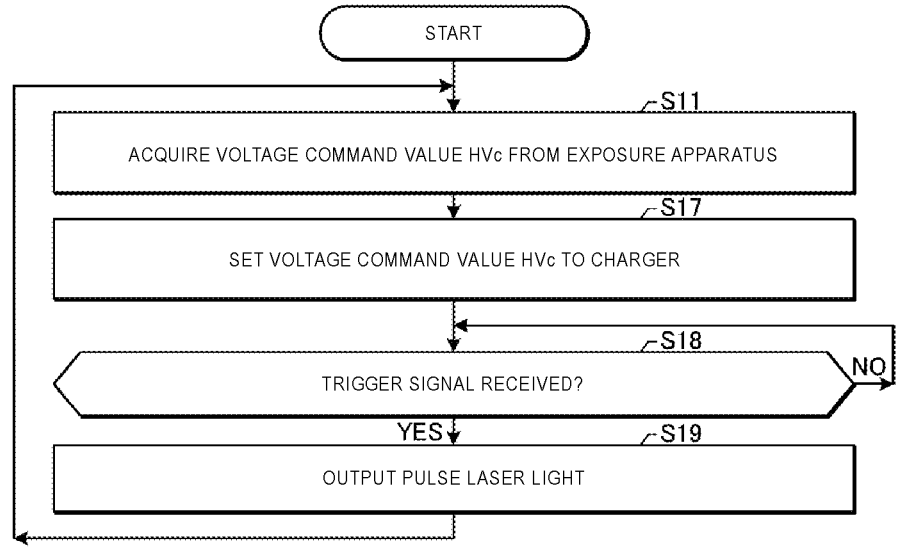
FIG. 6 is a flowchart showing processing performed by the laser control processor for outputting pulse laser light in the comparative example.

FIG. 6 is a flowchart showing processing performed by the laser control processor 130 for outputting the pulse laser light in the comparative example. In the comparative example, the pulse laser light is output using the voltage command value HVc received from the exposure control processor 210 as it is as described below.

In S11, the laser control processor 130 receives the voltage command value HVc from the exposure control processor 210 of the exposure apparatus 200 to acquire the voltage command value HVc.

In S17, the laser control processor 130 sets the voltage command value HVc to the charger 12.

In S18, the laser control processor 130 determines whether or not the trigger signal has been received from the exposure control processor 210. When the trigger signal is not received (S18:NO), the laser control processor 130 waits until the trigger signal is received. When the trigger signal is received (S18:YES), the laser control processor 130 advances processing to S19.

In S19, the laser control processor 130 transmits the oscillation trigger signal based on the trigger signal to the pulse power module 13, thereby causing the laser device 100 to output the pulse laser light.

After S19, the laser control processor 130 returns processing to S11 and repeats the processes from S11 to S19 to repeat the output of the pulse laser light.

1.6.2 Laser Control by Exposure Control Processor 210

Figure 7:
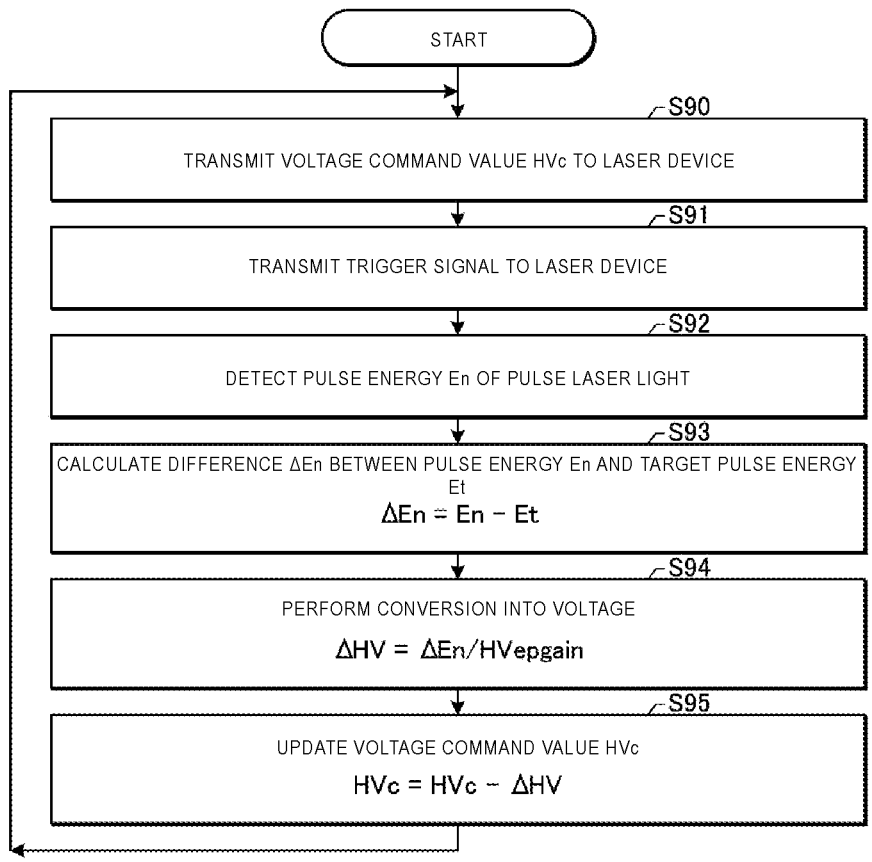
FIG. 7 is a flowchart showing processing of laser control performed by the exposure control processor in the comparative example.

FIG. 7 is a flowchart showing processing of laser control performed by the exposure control processor 210 in the comparative example. The exposure control processor 210 determines the voltage command value HVc so that the pulse energy En of the pulse laser light approaches the target pulse energy Et as follows.

In S90, the exposure control processor 210 transmits the voltage command value HVc to the laser control processor 130 of the laser device 100. When the voltage command value HVc is transmitted for the first time, the exposure control processor 210 transmits the voltage command value HVc calculated based on the target pulse energy Et. When the voltage command value HVc is transmitted for the second time or later, the exposure control processor 210 transmits the voltage command value HVc updated in S95.

In S91, the exposure control processor 210 transmits the trigger signal to the laser control processor 130. Thus, the laser device 100 outputs the pulse laser light.

In S92, the exposure control processor 210 detects the pulse energy En of the pulse laser light output from the laser device 100 through the energy monitor 220.

In S93, the exposure control processor 210 calculates a difference $\Delta En$ between the detected pulse energy En and the target pulse energy Et by the following equation.

$$\Delta En=En-Et$$

As the target pulse energy Et, a constant value is set for one burst output.

In S94, the exposure control processor 210 converts the difference $\Delta En$ into a voltage correction amount $\Delta HV$ by the following equation.

$$\Delta HV=\Delta En/HVepgain$$

Here, HVepgain represents the ratio of the amount of change in the pulse energy En with respect to the amount of change in the voltage command value HVc.

In S95, the exposure control processor 210 updates the voltage command value HVc by the following equation.

$$HVc=HVc-\Delta HV$$

For example, when the pulse energy En detected in S92 is smaller than the target pulse energy Et, the difference $\Delta En$ and the correction amount $\Delta HV$ become negative values in S93 and S94. In this case, the correction amount $\Delta HV$ which is a negative value is subtracted from the voltage command value HVc in S95, and the pulse energy En of the subsequent pulse increases.

After S95, the exposure control processor 210 returns processing to S90 and repeats the processes from S90 to S95 to calculate the voltage command value HVc and cause the laser device 100 to output the pulse laser light.

1.7 Problem of Comparative Example

Figure 8:
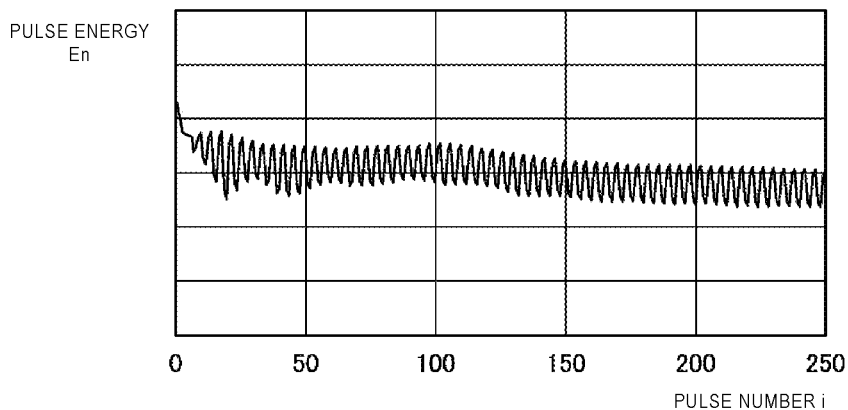
FIG. 8 is a graph showing a change in the pulse energy when the pulse laser light is output while performing switching between target wavelengths.

FIG. 8 is a graph showing a change in the pulse energy En when the pulse laser light is output while performing switching between the target wavelengths $\lambda 1$ and $\lambda 2$. In FIG. 8, the horizontal axis represents a pulse number i in the burst output, and the vertical axis represents the pulse energy En. The voltage command value HVc is set to a constant value. Even when the voltage command value HVc is a constant value, the pulse energy En may change. By controlling the voltage command value HVc based on the target pulse energy Et described with respect to FIG. 7, the change in the pulse energy En can be suppressed to some extent.

However, when switching between the target wavelengths $\lambda 1$ and $\lambda 2$ is performed at a high speed as described with reference to FIG. 5, the pulse energy En may fluctuate in accordance with the switching between the target wavelengths $\lambda 1$ and $\lambda 2$ as shown in FIG. 8. As a factor of the fluctuation of the pulse energy En in accordance with the switching between the target wavelengths $\lambda 1$ and $\lambda 2$, vibration of the optical components due to high-speed driving of the mirror 63 is considered. When the pulse energy En fluctuates frequently, the pulse energy En may not be sufficiently stabilized by the control described with respect to FIG. 7.

Further, the fluctuation of the pulse energy En includes a large number of frequency components corresponding to the inverse of the wavelength change cycle. The inverse of the wavelength change cycle corresponds to the frequency of switching between the target wavelengths $\lambda 1$ and $\lambda 2$. Therefore, the integration value of the pulse energy En of the pulse laser light generated at the target wavelength λ1 may not coincide with the integration value of the pulse energy En of the pulse laser light generated at the target wavelength λ2. In this case, the exposure performance may be uneven in the thickness direction of the resist film.

2. Laser Device which Calculates Correction Data Using Time-Series Data of Pulse Energy En[ ]

2.1 Configuration

Figure 9:
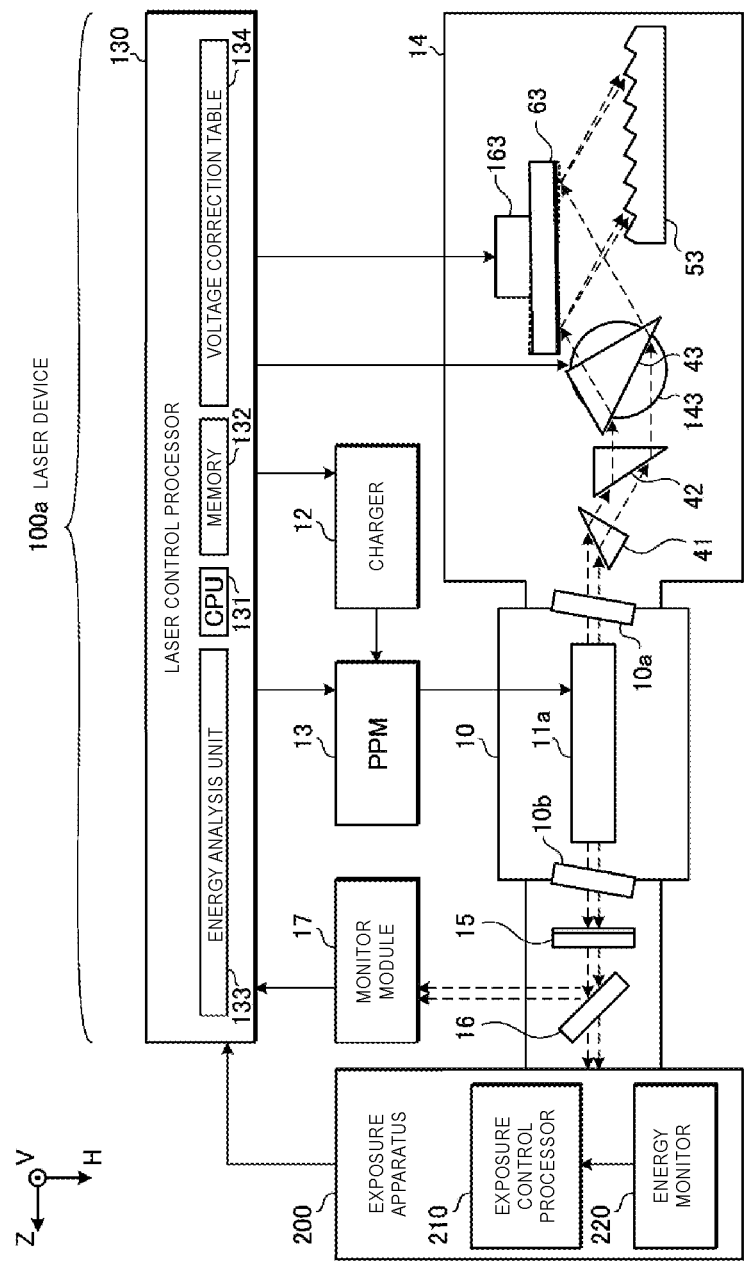
FIG. 9 schematically shows the configuration of the laser device of a first embodiment.

FIG. 9 schematically shows the configuration of a laser device 100a of a first embodiment. In the first embodiment, the laser control processor 130 includes an energy analysis unit 133 and a voltage correction table 134.

The energy analysis unit 133 performs statistical processing on the data of the pulse energy En received from the monitor module 17 to calculate correction data. The energy analysis unit 133 may include a control program for such statistical processing and calculation of the correction data. Alternatively, the energy analysis unit 133 may include hardware for such statistical processing and calculation of the correction data.

The voltage correction table 134 stores correction data for correcting the voltage command value HVc in accordance with the change of the wavelength of the pulse laser light. The voltage correction table 134 corresponds to the table in the present disclosure.

Figure 10:
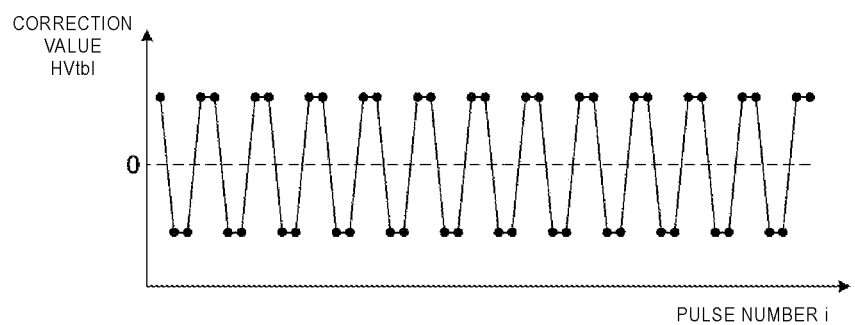
FIG. 10 is a graph showing correction data included in a voltage correction table.

FIG. 10 is a graph showing correction data included in the voltage correction table 134. In FIG. 10, the horizontal axis represents the pulse number i in the burst output, and the vertical axis represents a correction value HVtbl included in the correction data. The correction value HVtbl changes corresponding to switching between the target wavelengths λ1 and λ2. The voltage correction table 134 may be a table in which the correction value HVtbl is stored for each pulse number i, or may be in a form of a function, a matrix, or the like.

In other respects, the configuration of the first embodiment is similar to that of the comparative example.

2.2 Control Block Diagram

Figure 11:
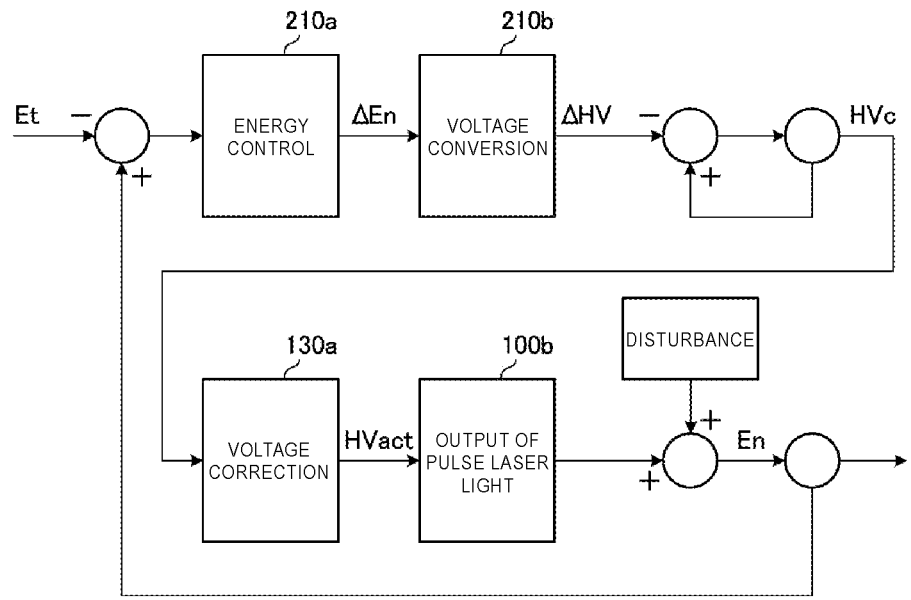
FIG. 11 is a control block diagram of the pulse energy in the first embodiment.

FIG. 11 is a control block diagram of the pulse energy En in the first embodiment.

An energy control block 210a corresponds to the process in which the exposure control processor 210 calculates the difference ΔEn in S93 of FIG. 7.

A voltage conversion block 210b corresponds to the process in which the exposure control processor 210 calculates the correction amount ΔHV in S94 of FIG. 7. The voltage command value HVc is corrected by using the correction amount ΔHV.

A voltage correction block 130a corresponds to the process in which the laser control processor 130 corrects the voltage command value HVc received from the exposure control processor 210 to calculate a voltage setting value HVact. This process will be described later with reference to FIG. 12.

A pulse laser light output block 100b corresponds to the process in which the laser device 100a applies a high voltage to the discharge electrode 11a in accordance with the voltage setting value HVact to output pulse laser light. The pulse energy En of the pulse laser light is fed back to the above-described processes performed by the exposure control processor 210.

2.3 Output Control of Pulse Laser Light

Figure 12:
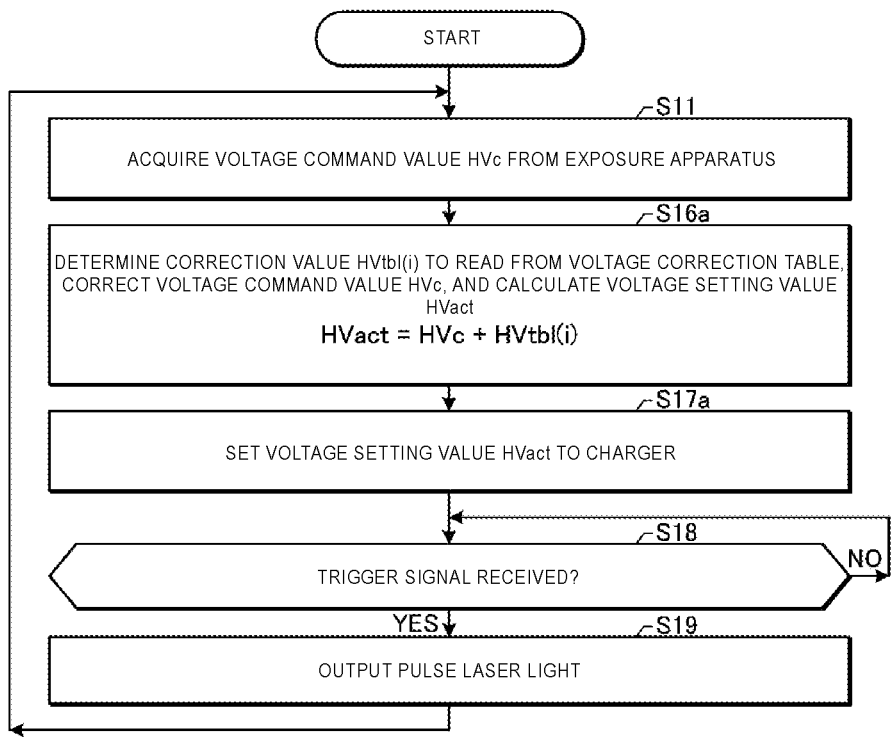
FIG. 12 is a flowchart showing processing performed by the laser control processor for outputting the pulse laser light in the first embodiment.

FIG. 12 is a flowchart showing processing performed by the laser control processor 130 for outputting the pulse laser light in the first embodiment. In the first embodiment, the voltage setting value HVact is calculated by correcting the voltage command value HVc received from the exposure control processor 210 as follows.

The process of S11 is similar to that described with reference to FIG. 6.

In S16a, the laser control processor 130 determines a correction value HVtbl(i) to read from the voltage correction table 134. Here, (i) corresponds to the i-th pulse in the burst output. For example, when correcting the voltage command value HVc of the first pulse in the burst output, the correction value is HVtbl(1). The laser control processor 130 corrects the voltage command value HVc and calculates the voltage setting value HVact by the following equation using the read correction value HVtbl(i).

$$HVact = HVc + HVtbl(i)$$

The voltage setting value HVact corresponds to the corrected voltage command value in the present disclosure.

In S17a, the laser control processor 130 sets the voltage setting value HVact to the charger 12.

The processes of S18 and S19 are similar to those described with reference to FIG. 6.

As described above, by reading the correction value HVtbl(i) from the voltage correction table 134 and correcting the voltage command value HVc, the correction of the voltage command value HVc can be performed at high speed for each pulse, and the pulse energy En can be stabilized.

In the first embodiment, the laser control performed by the exposure control processor 210 is similar to that described with reference to FIG. 7.

2.4 Update Timing of Voltage Correction Table 134

Figure 13:
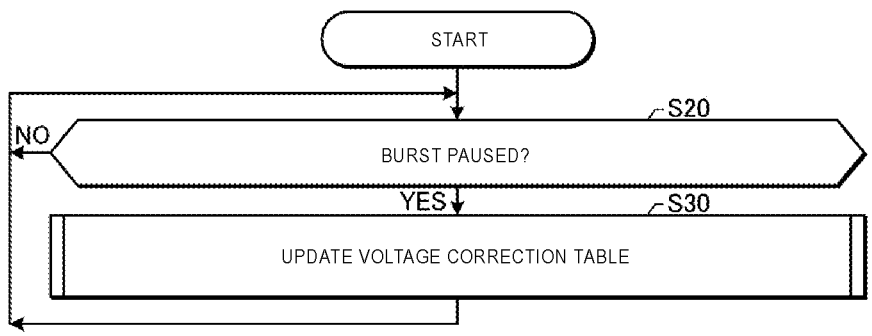
FIG. 13 is a flowchart showing update processing of the voltage correction table performed by the laser control processor in the first embodiment.

FIG. 13 is a flowchart showing update processing of the voltage correction table 134 performed by the laser control processor 130 in the first embodiment.

In S20, the laser control processor 130 determines whether or not the burst output is paused. For example, in a case in which the output of the pulse laser light is not performed for 1 second or more, it is determined that the burst output is paused. When the burst output is paused (S20:YES), the laser control processor 130 advances processing to S30.

In S30, the laser control processor 130 updates the correction data included in the voltage correction table 134. The process of S30 is performed by the energy analysis unit 133. Details of S30 will be described later with reference to FIG. 14.

When the burst output is not paused (S20:NO) or after S30, the laser control processor 130 returns processing to S20.

Through such processing, the laser control processor 130 updates the correction data during the pause period which is a period after a first burst output is completed and before a second burst output subsequent to the first burst output is started. The period during which the first burst output is performed is an example of the first period in the present disclosure, and the period during which the second burst output is performed is an example of the second period in the present disclosure.

2.5 Update Processing of Voltage Correction Table 134

Figure 14:
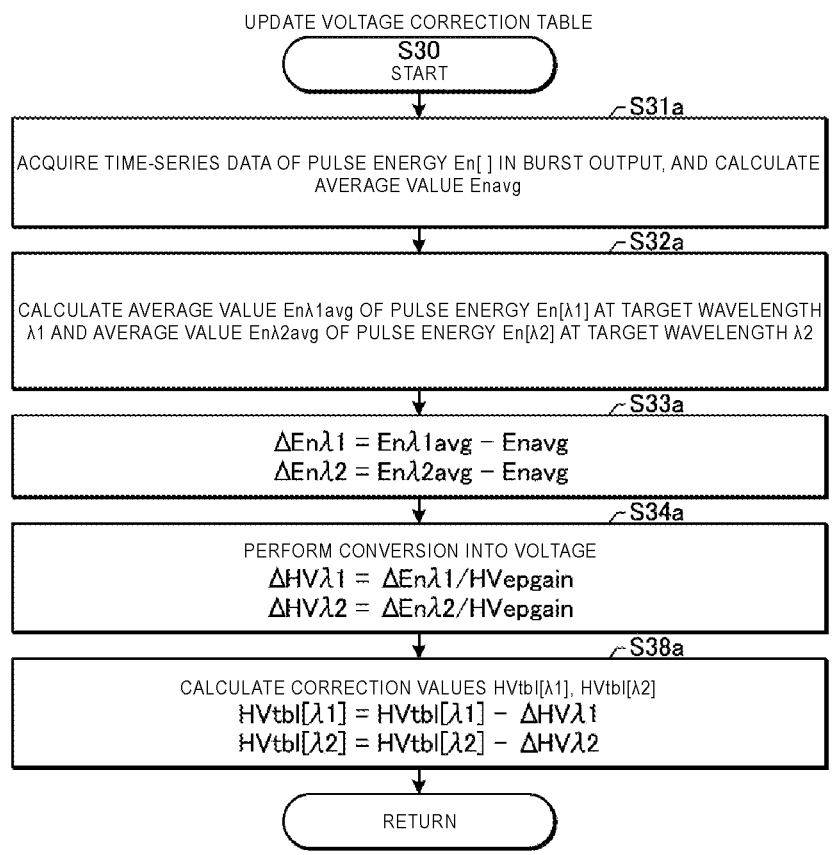
FIG. 14 is a flowchart showing details of the update processing of the voltage correction table in the first embodiment.
Figure 15:
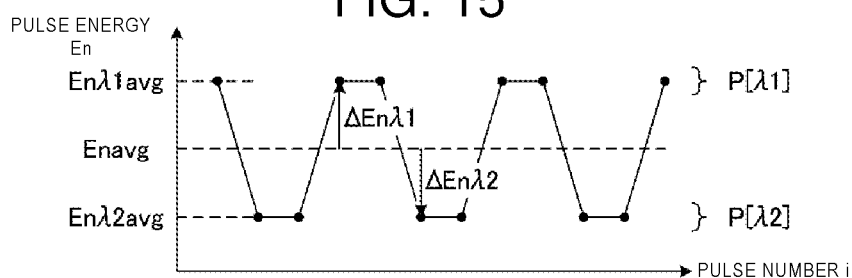
FIG. 15 is a graph conceptually showing average values and differences calculated in FIG. 14.

FIG. 14 is a flowchart showing details of the update processing of the voltage correction table 134 in the first embodiment. The processing shown in FIG. 14 corresponds to the subroutine of S30 of FIG. 13. FIG. 15 is a graph conceptually showing average values Enavg, Enλ1avg, Enλ2avg and differences ΔEnλ1, ΔEnλ2 calculated in FIG.

14. In FIG. 15, the horizontal axis represents the pulse number i in the burst output, and the vertical axis represents the pulse energy En.

In S31a of FIG. 14, the laser control processor 130 obtains time-series data of a plurality of pulse energy En[ ] in the burst output. Here, [ ] means an array, and when [ ] is blank, it means the entire array corresponding to one burst output. The time-series data of the pulse energy En[ ] corresponds to the first time-series data in the present disclosure. As shown in FIG. 15, the pulse energy En may fluctuate depending on the target wavelengths λ1, λ2.

The laser control processor 130 calculates the average value Enavg of the pulse energy En[ ]. The average value Enavg corresponds to the third average value in the present disclosure, and serves as a reference for calculating the correction data.

In S32a, the laser control processor 130 calculates the average value Enλ1avg of the pulse energy En[λ1] at the target wavelength λ1 and the average value Enλ2avg of the pulse energy En[λ2] at the target wavelength λ2. The pulse energy En[λ1] means an array of the pulse energy En of the first wavelength pulse P[λ1] output at the target wavelength λ1 among the pulse energy En[ ]. Similarly, the pulse energy En[λ2] means an array of the pulse energy En of the second wavelength pulse P[λ2] output at the target wavelength λ2. The average value Enλ1avg corresponds to the first average value in the present disclosure, and the average value Enλ2avg corresponds to the second average value in the present disclosure.

In S33a, the laser control processor 130 calculates the difference ΔEnλ1 between the average value Enλ1avg and the average value Enavg and the difference ΔEnλ2 between the average value Enλ2avg and the average value Enavg by the following equations.

$$\Delta En\lambda 1 = En\lambda 1 avg - Enavg$$

$$\Delta En\lambda 2 = En\lambda 2 avg - Enavg$$

In S34a, the laser control processor 130 converts the differences ΔEnλ1, ΔEnλ2 into voltage correction amounts ΔHVλ1, ΔHVλ2, respectively, by the following equations.

$$\Delta HV1 = \Delta En\lambda 1 / HVepgain$$

$$\Delta HV\lambda 2 = \Delta En\lambda 2 / HVepgain$$

In S38a, the laser control processor 130 calculates the correction values HVtbl[λ1], HVtbl[λ2] by the following equations, and updates the correction data included in the voltage correction table 134.

$$HVtbl[\lambda 1] = HVtbl[\lambda 1] - \Delta HV\lambda 1$$

$$HVtbl[\lambda 2] = HVtbl[\lambda 2] - \Delta HV\lambda 2$$

In this way, the correction values HVtbl[λ1], HVtbl[λ2] are calculated for each target wavelength. Here, the initial values of HVtbl[λ1] and HVtbl[λ2] may be set in advance by the adjustment light emission (see FIG. 4).

In order to prevent over-correction, the correction values HVtbl[λ1], HVtbl[λ2] may be calculated by using values obtained by multiplying the correction amounts ΔHVλ1, ΔHVλ2 by a factor larger than 0 and smaller than 1, respectively.

The calculated correction value HVtbl[λ1] is an array with all values being the same. Similarly, the correction value HVtbl[λ2] is an array with all values being the same.

However, the present disclosure is not limited thereto, and the correction values HVtbl[λ1], HVtbl[λ2] may be changed in one burst output. For example, the correction values HVtbl[λ1], HVtbl[λ2] may be calculated using values obtained by multiplying the correction amounts ΔHVλ1, ΔHVλ2 by a function of time.

According to the processing shown in FIG. 14, the correction data including the correction values HVtbl[λ1], HVtbl[λ2] is calculated using the time-series data of the pulse energy En[ ] in the first burst output. The correction data is stored in the voltage correction table 134. In the second burst output subsequent to the first burst output, the voltage command value HVc is corrected using the correction data read from the voltage correction table 134 in the process of S16a of FIG. 12. The total average of the correction values HVtbl[λ1], HVtbl[λ2] may be set to 0 so that the integration value of the pulse energy En[ ] does not change even when the voltage command value HVc is corrected (see FIG. 10).

2.6 Effect (1) According to the first embodiment, the correction data of the voltage command value HVc is calculated using the time-series data of the pulse energy En[ ] of the plurality of pulses output while the wavelength is periodically changed.

Accordingly, the voltage command value HVc can be corrected to suppress the fluctuation of the pulse energy En caused by the change of the wavelength.

(2) According to the first embodiment, the correction data is calculated after the end of the period in which the first burst output is performed and before the start of the period in which the second burst output subsequent to the first burst output is performed.

Accordingly, it is possible to correct the voltage command value HVc for each burst output using the latest data.

(3) According to the first embodiment, the correction data is stored in the voltage correction table 134, and the voltage command value HVc is corrected using the correction data read from the voltage correction table 134.

By using the voltage correction table 134, the voltage command value HVc can be corrected at high speed.

(4) According to the first embodiment, the correction data is calculated using the average value Enavg of the pulse energy En[ ] as a reference.

Accordingly, even when the target pulse energy Et set in the exposure apparatus 200 is unknown, the voltage command value HVc can be appropriately corrected using the average value Enavg as a reference.

(5) According to the first embodiment, the average value Enλ1avg of the pulse energy En[λ1] at the target wavelength λ1, the average value Enλ2avg of the pulse energy En[λ2] at the target wavelength λ2, and the average value Enavg of the pulse energy En[ ] are calculated. The correction data is calculated using the difference ΔEnλ1 between the average value Enλ1avg and the average value Enavg and the difference ΔEnλ2 between the average value Enλ2avg and the average value Enavg.

Accordingly, the integration value of the pulse energy En[λ1] at the target wavelength λ1 and the integration value of the pulse energy En[λ2] at the target wavelength λ2 can be brought close to each other. Thus, the exposure performance can be made uniform in the thickness direction of the resist film.

(6) According to the first embodiment, each of the correction value HVtbl[λ1] and the correction value HVtbl[λ2] is calculated for the corresponding target wavelength set in the period in which the first burst output is performed.

Accordingly, the correction data including the correction values HVtbl[λ1], HVtbl[λ2] can be calculated at high speed.

In other respects, the first embodiment is similar to the comparative example.

3. Laser Device in which Correction Data is Calculated Further Using Time-Series Data of Voltage Command Value HVc[ ]

3.1 Update Processing of Voltage Correction Table 134

Figure 16:
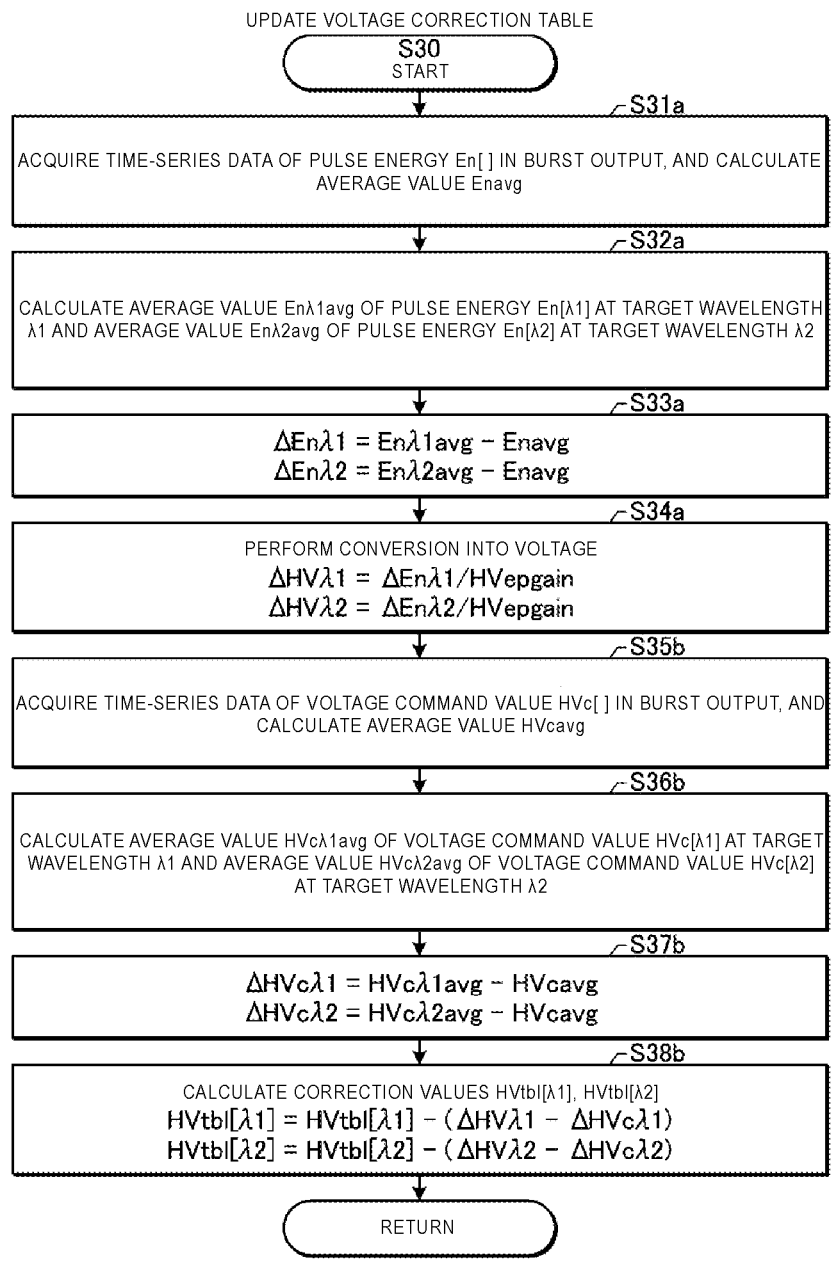
FIG. 16 is a flowchart showing details of the update processing of the voltage correction table in a second embodiment.
Figure 17:
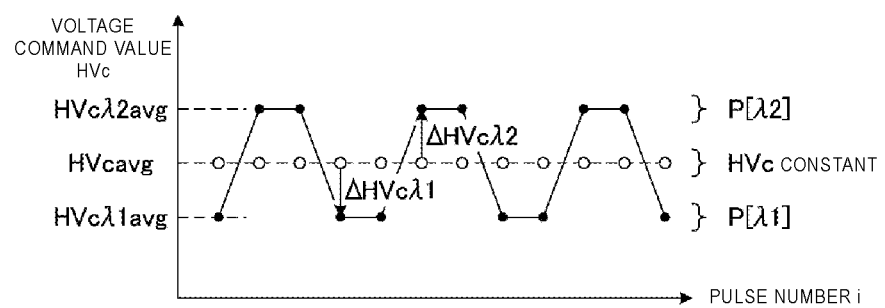
FIG. 17 is a graph conceptually showing average values and differences calculated in FIG. 16.
Figure 18:
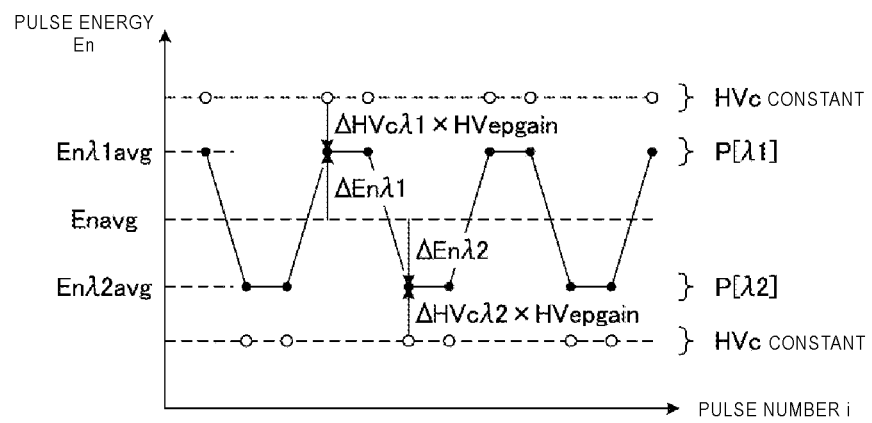
FIG. 18 is a graph conceptually showing average values and differences calculated in FIG. 16.

FIG. 16 is a flowchart showing details of the update processing of the voltage correction table 134 in a second embodiment. The processing shown in FIG. 16 corresponds to the subroutine of S30 of FIG. 13. FIG. 17 is a graph conceptually showing average values Hvcavg, HVcλ1avg, HVcλ2avg and differences ΔHVcλ1, ΔHVcλ2 calculated in FIG. 16. In FIG. 17, the horizontal axis represents the pulse number i in the burst output, and the vertical axis represents the voltage command value HVc. FIG. 18 is a graph conceptually showing the average values Enavg, Enλ1avg, Enλ2avg and the differences ΔEnλ1, ΔEnλ2 calculated in FIG. 16. In FIG. 18, the horizontal axis represents the pulse number i in the burst output, and the vertical axis represents the pulse energy En.

The processes of S31a to S34a in FIG. 16 are similar to those described with reference to FIG. 14. As described with reference to FIG. 7, when the voltage command value HVc is controlled so that the pulse energy En approaches the target pulse energy Et, as shown in FIG. 17, the change of the voltage command value HVc may include a frequency component corresponding to the inverse of the wavelength change period. The fluctuation of the pulse energy En is suppressed to some extent by the change of the voltage command value HVc. However, it may not be possible to sufficiently cancel the fluctuation of the pulse energy En simply by canceling the fluctuation of the measured pulse energy En by the processes from S31a to S34a. In order to further stabilize the pulse energy En, it is desirable to correct for the amount of change of the voltage command value HVc.

In S35b, the laser control processor 130 acquires the time-series data of a plurality of the voltage command values HVc[ ] in the burst output. The time-series data of the voltage command value HVc[ ] corresponds to the second time-series data in the present disclosure.

The laser control processor 130 calculates the average value HVcavg of the voltage command values HVc[ ]. The average value HVcavg corresponds to the sixth average value in the present disclosure, and serves as a reference for calculating the correction data.

In S36b, the laser control processor 130 calculates the average value HVcλ1avg of the voltage command value HVc[λ1] at the target wavelength λ1 and the average value HVcλ2avg of the voltage command value HVc[λ2] at the target wavelength λ2. The voltage command value HVc[λ1] means an array of the voltage command value HVc when the first wavelength pulse P[λ1] is output at the target wavelength λ1 among the voltage command value HVc[ ]. Similarly, the voltage command value HVc[λ2] means an array of the voltage command value HVc when the second wavelength pulse P[λ2] is output at the target wavelength λ2. The average value HVcλ1avg corresponds to the fourth average value in the present disclosure, and the average value HVcλ2avg corresponds to the fifth average value in the present disclosure.

In S37b, the laser control processor 130 calculates the difference ΔHVcλ1 between the average value HVcλ1avg and the average value HVcavg and the difference ΔHVcλ2 between the average value HVcλ2avg and the average value HVcavg by the following equations.

$$\Delta HVc\lambda1 = HVc\lambda1avg - HVcavg$$

$$\Delta HVc\lambda2 = HVc\lambda2avg - HVcavg$$

In S38b, the laser control processor 130 calculates the correction values HVtbl[λ1], HVtbl[λ2] by the following equations, and updates the correction data included in the voltage correction table 134.

$$HVtbl[\lambda1] = HVtbl[\lambda1] - (\Delta HV\lambda1 - \Delta HVc\lambda1)$$

$$HVtbl[\lambda2] = HVtbl[\lambda2] - (\Delta HV\lambda2 - \Delta HVc\lambda2)$$

In FIG. 17, it is assumed that, when the voltage command value HVc is changed, the voltage command value HVc becomes ΔHVcλ1 lower when the target wavelength λ1 is set and the voltage command value HVc becomes ΔHVcλ2 higher when the target wavelength λ2 is set, as compared with the case in which the voltage command value HVc is constant at the average value HVcavg.

In this case, as shown in FIG. 18, when the voltage command value HVc is changed, the pulse energy En becomes ΔHVcλ1×HVepgain lower when the target wavelength λ1 is set as compared with the case in which the voltage command value HVc is constant. Therefore, the pulse energy En can be further stabilized by not only performing correction based on the difference ΔEnλ1 by the processes from S31a to S34a but also performing correction using the time-series data of the voltage command value HVc[ ] by the processes from S35b to S38b.

Similarly, when the voltage command value HVc is changed, the pulse energy En becomes ΔHVcλ2×HVepgain higher when the target wavelength λ2 is set as compared with the case in which the voltage command value HVc is constant. Therefore, the pulse energy En can be further stabilized by not only performing correction based on the difference ΔEnλ2 but also performing correction using the time-series data of the voltage command value HVc[ ].

In order to prevent over-correction, the correction value HVtbl[λ1] may be calculated by using a value obtained by multiplying the correction amounts ΔHVλ1, ΔHVcλ1 by a factor larger than 0 and smaller than 1. Further, the correction value HVtbl[λ2] may be calculated by using a value obtained by multiplying the correction amounts ΔHVλ2, ΔHVcλ2 by a factor larger than 0 and smaller than 1.

3.2 Effect (7) According to the second embodiment, the correction data is calculated using the time-series data of the plurality of voltage command values HVc[ ] set in the period in which the first burst output is performed.

Accordingly, the amount of change of the voltage command value HVc set by the exposure apparatus 200 can also be corrected, and the correction can be performed more appropriately.

(8) According to the second embodiment, the correction data is calculated using the average value HVcavg of the voltage command value HVc[ ] as a reference.

Accordingly, even when the target pulse energy Et set in the exposure apparatus 200 is unknown, it is possible to appropriately perform correction using the average value HVcavg as a reference.

(9) According to the second embodiment, the average value HVcλ1avg of the voltage command value HVc[λ1] when the target wavelength λ1 is set, the average value HVcλ2avg of the voltage command value HVc[λ2] when the target wavelength λ2 is set, and the average value HVcavg of the voltage command value HVc[ ] are calculated. The correction data is calculated using the difference ΔHVcλ1 between the average value HVcλ1avg and the average value HVcavg and the difference ΔHVcλ2 between the average value HVcλ2avg and the average value HVcavg.

Accordingly, the integration value of the pulse energy En[λ1] at the target wavelength λ1 and the integration value of the pulse energy En[λ2] at the target wavelength λ2 can be brought close to each other while performing correction for the amount of change of the voltage command value HVc set by the exposure apparatus 200 as well.

In other respects, the second embodiment is similar to the first embodiment.

4. Laser Device in which Fourier Transform is Performed on Time-Series Data of Pulse Energy En[ ] to Calculate Correction Data

4.1 Update Processing of Voltage Correction Table 134

Figure 19:
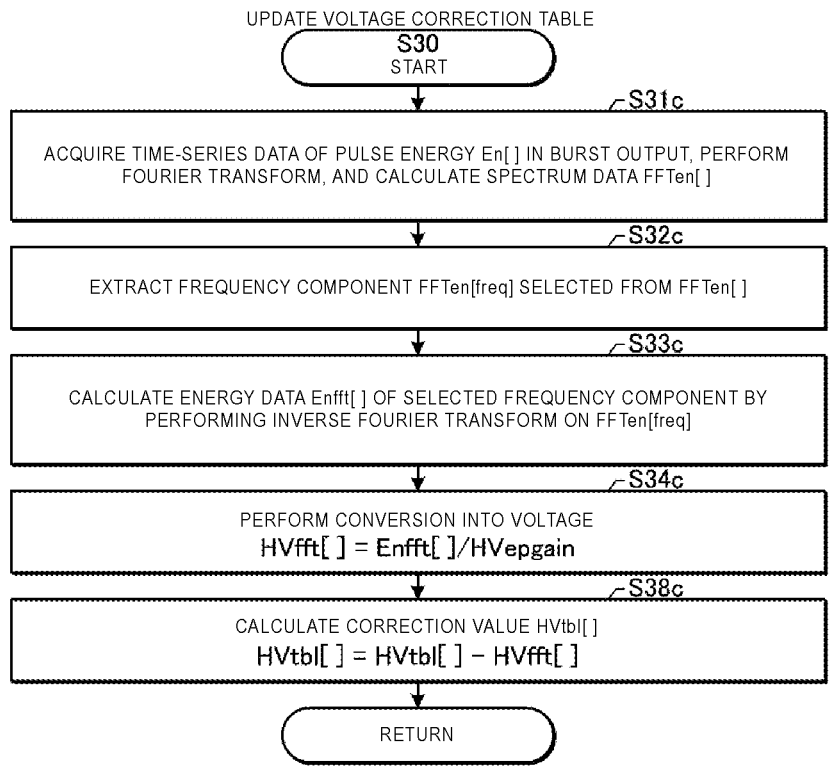
FIG. 19 is a flowchart showing details of the update processing of the voltage correction table in a third embodiment.
Figure 20:
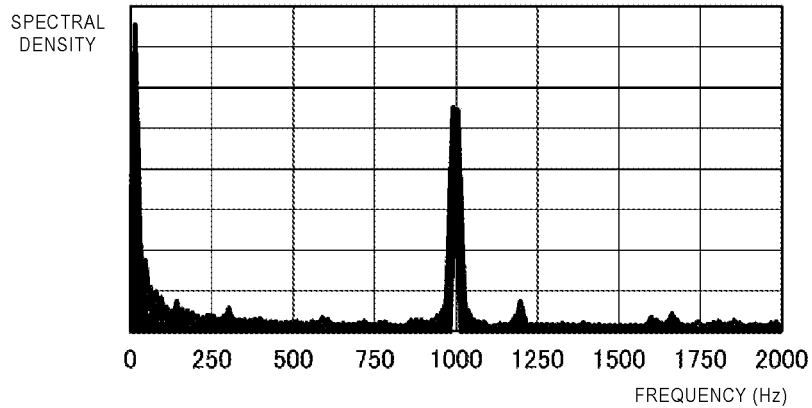
FIG. 20 is a graph of spectrum data obtained by performing Fourier transform on time-series data of the pulse energy in FIG. 19.

FIG. 19 is a flowchart showing details of the update processing of the voltage correction table 134 in a third embodiment. The processing shown in FIG. 19 corresponds to the subroutine of S30 of FIG. 13. FIG. 20 is a graph of spectrum data FFTen[ ] obtained by performing Fourier transform on the time-series data of the pulse energy En[ ] in FIG. 19. In FIG. 20, the horizontal axis represents a frequency, and the vertical axis represents spectral density.

In S31c of FIG. 19, the laser control processor 130 obtains the time-series data of a plurality of pulses of the pulse energy En[ ] in the burst output.

The laser control processor 130 performs Fourier transform on the time-series data of the pulse energy En[ ] to calculate the spectrum data FFTen[ ]. The Fourier transform can be fast Fourier transform. As shown in FIG. 20, the spectrum data FFTen[ ] obtained by performing Fourier transform on the time-series data of the pulse energy En[ ] of the pulse laser light output while the wavelength is periodically changed has a peak at a particular frequency. This frequency corresponds to the inverse of the wavelength change period.

In S32c, the laser control processor 130 extracts a frequency component FFTen[freq] selected from the spectrum data FFTen[ ]. Here, the frequency component FFTen[freq] corresponding to the inverse of the wavelength change period is selected. In the example shown in FIG. 20, the frequency component of 1000 Hz is selected. Alternatively, a frequency band including the peak of the spectrum data FFTen[ ] and frequencies around the peak may be selected. Alternatively, when the spectrum data FFTen[ ] includes a plurality of peaks, a plurality of frequency components corresponding to the peaks may be selected.

In S33c, the laser control processor 130 calculates energy data Enfft[ ] of the selected frequency by performing inverse Fourier transform on the frequency component FFTen[freq]. The energy data Enfft[ ] includes the energy amplitude for each pulse. The inverse Fourier transform can be inverse fast Fourier transform.

In S34c, the laser control processor 130 converts the energy data Enfft[ ] into a voltage correction amount HVfft[ ] by the following equation.

$$HVfft[\ ] = Enfft[\ ]/HVepgain$$

In S38c, the laser control processor 130 calculates the correction value HVtbl[ ] by the following equation, and updates the correction data included in the voltage correction table 134.

$$HVtbl[\ ] = HVtbl[\ ] - HVfft[\ ]$$

In this way, the correction value HVtbl[ ] is calculated for each pulse in the burst output. Here, the initial value of the correction value HVtbl[ ] may be set in advance by the adjustment light emission (see FIG. 4).

In order to prevent over-correction, the correction value HVfft[ ] may be calculated by using a value obtained by multiplying the correction amount HVfft[ ] by a factor larger than 0 and smaller than 1.

4.2 Effect

(10) According to the third embodiment, the correction data is calculated by extracting the selected frequency component from the time-series data of the pulse energy En[ ] of the plurality of pulses output in the period in which the first burst output is performed.

Accordingly, it is possible to stabilize the pulse energy En by reducing fluctuation of the selected frequency component of the pulse energy En.

(11) According to the third embodiment, the selected frequency component is a frequency component corresponding to the inverse of the wavelength change period when the pulse laser light is output in the period in which the first burst output is performed.

Accordingly, it is possible to stabilize the pulse energy En by reducing the fluctuation of the frequency component corresponding to the switching frequency of the target wavelengths λ1, λ2.

(12) According to the third embodiment, the spectrum data FFTen[ ] is calculated by performing Fourier transform on the time-series data of the pulse energy En[ ]. The energy data Enfft[ ] is calculated by performing inverse Fourier transform on the selected frequency component FFTen[freq] of the spectrum data FFTen[ ]. The correction data is calculated using the energy data Enfft[ ].

Accordingly, since the correction data corresponding to the phase shift between the switching of the target wavelengths λ1 and λ2 and the fluctuation of the pulse energy En is calculated, the pulse energy En can be further stabilized.

(13) According to the third embodiment, the correction value HVtbl[ ] is calculated for each pulse output during the period in which the first burst output is performed.

Accordingly, it is possible to calculate the appropriate correction value HVtbl[ ] for each pulse.

In other respects, the third embodiment is similar to the first embodiment.

5. Laser Device in which Fourier Transform is Performed on Time-Series Data of Voltage Command Value HVc[ ] to Calculate Correction Data

5.1 Update Processing of Voltage Correction Table 134

Figure 21:
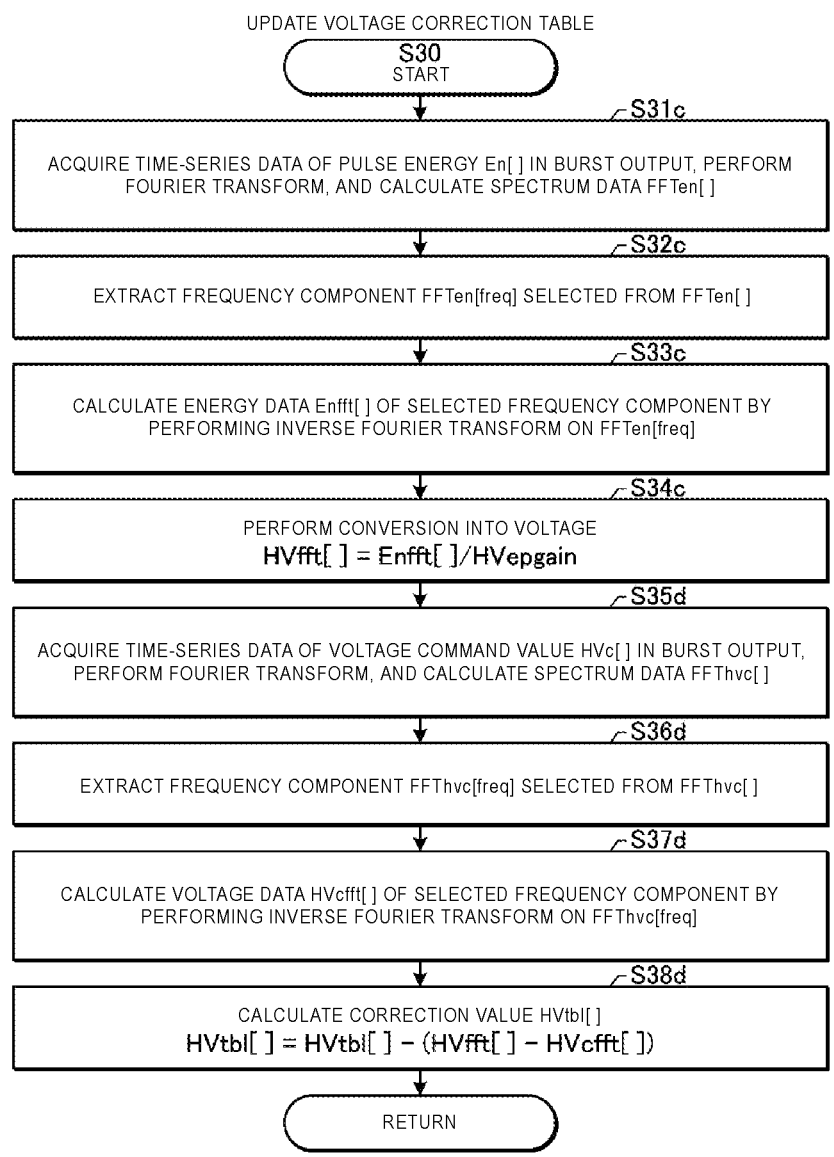
FIG. 21 is a flowchart showing details of the update processing of the voltage correction table in a fourth embodiment.

FIG. 21 is a flowchart showing details of the update processing of the voltage correction table 134 in a fourth embodiment. The processing shown in FIG. 21 corresponds to the subroutine of S30 of FIG. 13.

The processes of S31c to S34c in FIG. 21 are similar to those described with reference to FIG. 19. As described with reference to FIG. 7, when the voltage command value HVc is controlled so that the pulse energy En approaches the target pulse energy Et, as shown in FIG. 17, the change of the voltage command value HVc may include a frequency component corresponding to the inverse of the wavelength change period. As described in the second embodiment, to further stabilize the pulse energy En, it is desirable to correct for the amount of change of the voltage command value HVc.

In S35d, the laser control processor 130 acquires the time-series data of a plurality of the voltage command values HVc[ ] in the burst output.

The laser control processor 130 performs Fourier transform on the time-series data of the voltage command value HVc[ ] to calculate spectrum data FFThvc[ ]. The Fourier transform can be fast Fourier transform.

In S36d, the laser control processor 130 extracts a frequency component FFThvc[freq] selected from the spectrum data FFThvc[ ]. The frequency of the frequency component FFThvc[freq] may be the same as the frequency of the frequency component FFTen[freq] selected in S32c.

In S37d, the laser control processor 130 calculates voltage data HVcfft[ ] of the selected frequency by performing inverse Fourier transform on the frequency component FFThvc[freq]. The voltage data HVcfft[ ] includes the voltage amplitude for each pulse. The Fourier transform can be inverse fast Fourier transform.

In S38d, the laser control processor 130 calculates the correction value HVtbl[ ] by the following equation, and updates the correction data included in the voltage correction table 134.

$$HVtbl[\ ]=HVtbl[\ ]-(HVfft[\ ]-HVcfft[\ ])$$

In order to prevent over-correction, the correction value HVtbl[ ] may be calculated by using a value obtained by multiplying the correction amounts HVfft[ ], HVcfft[ ] by a factor larger than 0 and smaller than 1.

5.2 Effect

(14) According to the fourth embodiment, the correction data is calculated by extracting the selected frequency component from the time-series data of the plurality of voltage command values HVc[ ] set in the period in which the first burst output is performed.

By using the time-series data of the voltage command value HVc[ ], the amount of change of the voltage command value HVc set by the exposure apparatus 200 can also be corrected, and the correction can be performed more appropriately.

(15) According to the fourth embodiment, the spectrum data FFThvc[ ] is calculated by performing Fourier transform on the time-series data of the voltage command value HVc[ ]. The voltage data HVcfft[ ] is calculated by performing inverse Fourier transform on the selected frequency component FFThvc[freq] of the spectrum data FFThvc[ ]. The correction data is calculated using the voltage data HVcfft[ ].

Accordingly, since the correction data corresponding to the phase shift between the switching of the target wavelengths λ1 and λ2 and the change of the voltage command value HVc is calculated, the pulse energy En can be further stabilized.

In other respects, the fourth embodiment is similar to the third embodiment.

6. Laser Device in which Correction Data is Calculated for Each Pulse Number j in Wavelength Change Period 6.1 Update Processing of Voltage Correction Table 134

Figure 22:
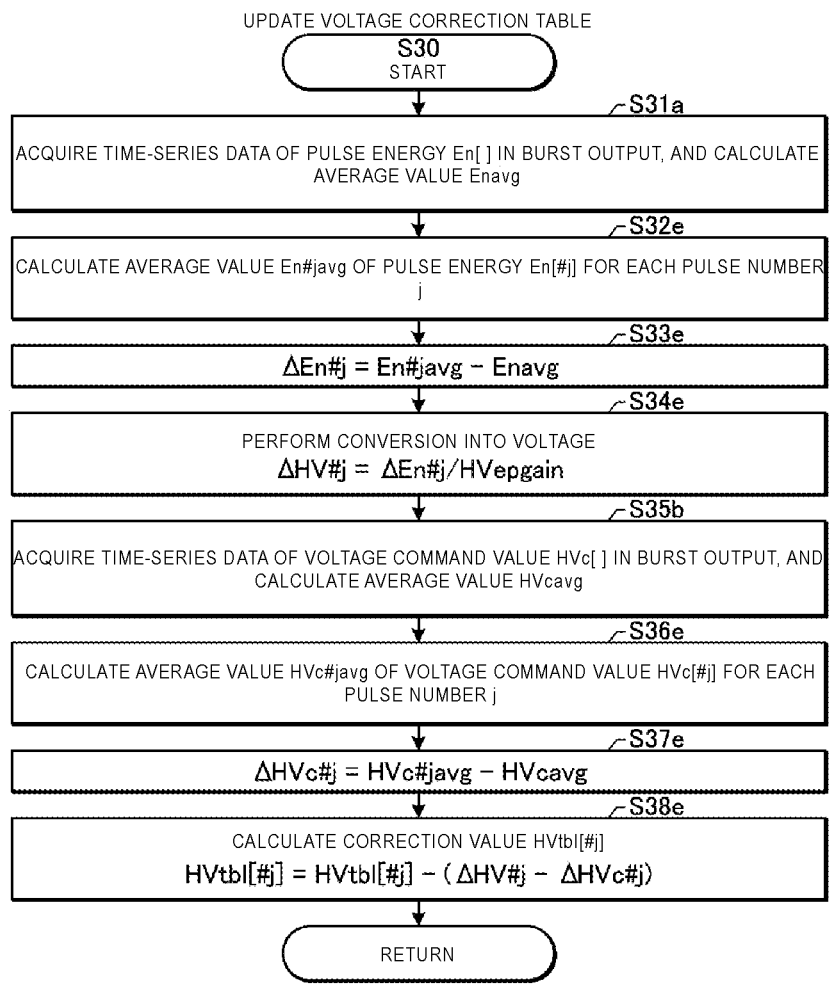
FIG. 22 is a flowchart showing details of the update processing of the voltage correction table in a fifth embodiment.
Figure 23:
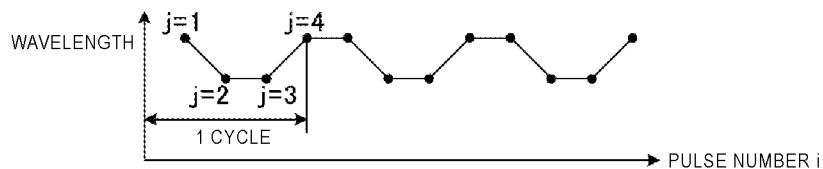
FIG. 23 is a graph showing periodically changing wavelengths.

FIG. 22 is a flowchart showing details of the update processing of the voltage correction table 134 in a fifth embodiment. The processing shown in FIG. 22 corresponds to the subroutine of S30 of FIG. 13. FIG. 23 is a graph showing periodically changing wavelengths. In FIG. 23, the horizontal axis represents the pulse number i in the burst output, and the vertical axis represents the wavelength. The pulse number j in the wavelength change period indicates the pulse number in the wavelength change period. For example, when the number of pulses in one cycle is 4, j is an integer from 1 to 4.

The process of S31a of FIG. 22 is similar to that described with respect to FIG. 14. Here, the average value Enavg of the pulse energy En[ ] corresponds to the ninth average value in the present disclosure.

In S32e, the laser control processor 130 calculates the average value En #javg of the pulse energy En[#j] for each pulse number j in the wavelength change period. The pulse energy En[#j] means an array of the pulse energy En of the pulse number j among the pulse energy En[ ]. The pulses having the pulse number j corresponds to, for example, pulses having the pulse number i of 1, 5, 9, . . . in the burst output when the value of j is 1, and corresponds to pulses having the pulse number i of 2, 6, 10, . . . in the burst output when the value of j is 2. For example, the average value En #javg is expressed as En #1avg when the value of j is 1, and is expressed as En #2avg when the value of j is 2. The average value En #1avg corresponds to the seventh average value in the present disclosure. The average value En #2avg corresponds to the eighth average value in the present disclosure. The number of the average values En #javg coincide with the maximum value of j.

In S33e, the laser control processor 130 calculates the difference ΔEn #j between the average value En #javg and the average value Enavg by the following equation.

$$\Delta En\ \#j = En\ \#javg - Enavg$$

For example, the difference ΔEn #j is expressed as En #1 when the value of j is 1, and is expressed as En #2 when the value of j is 2.

In S34e, the laser control processor 130 converts the difference ΔEn #j into a voltage correction amount ΔHV #j by the following equation.

$$\Delta HV\ \#j = \Delta En\ \#j / HVepgain$$

As in the first embodiment, the correction value HVtbl[#j] may be calculated using the correction amount ΔHV #j. However, as described with reference to FIG. 7, when the voltage command value HVc is controlled so that the pulse energy En approaches the target pulse energy Et, as shown in FIG. 17, the change of the voltage command value HVc may include a frequency component corresponding to the inverse of the wavelength change period. As described in the second embodiment, to further stabilize the pulse energy En, it is desirable to correct for the amount of change of the voltage command value HVc.

The process of S35b is similar to that described with reference to FIG. 16. Here, the average value HVcavg of the voltage command value HVc[ ] corresponds to the twelfth average value in the present disclosure.

In S36e, the laser control processor 130 calculates the average value HVc #javg of the voltage command value HVc[#j] for each pulse number j in the wavelength change period. The voltage command value HVc[#j] means an array of the voltage command value HVc of the pulse having the pulse number j among the voltage command value HVc[ ]. For example, the average value HVc #javg is expressed as HVc #1avg when the value of j is 1, and is expressed as HVc #2avg when the value of j is 2. The average value HVc #1avg corresponds to the tenth average value in the present disclosure, and the average value HVc #2avg corresponds to the eleventh average value in the present disclosure. The number of the average values HVc #javg coincide with the maximum value of j.

In S37e, the laser control processor 130 calculates the differences ΔHVc #j between the average values HVc #javg and the average values HVcavg by the following equation.

$$\Delta HVc\ \#j = HVc\ \#javg - HVcavg$$

For example, the difference ΔHVc #j is expressed as ΔHVc #1 when the value of j is 1, and is expressed as ΔHVc #2 when the value of j is 2.

In S38e, the laser control processor 130 calculates the correction value HVtbl[#j] by the following equation, and updates the correction data included in the voltage correction table 134.

$$HVtbl[\#j] = HVtbl[\#j] - (\Delta HV \#j - \Delta HVc \#j)$$

In this way, the correction value HVtbl[#j] is calculated for each pulse number j in the wavelength change period. Here, the initial value of HVtbl[#j] may be set in advance by the adjustment light emission (see FIG. 4).

In order to prevent over-correction, the correction value HVtbl[#j] may be calculated by using a value obtained by multiplying the correction amounts ΔHV #j, ΔHVc #j by a factor larger than 0 and smaller than 1.

The calculated correction value HVtbl[#j] is an array with all values being the same for the same pulse number j. However, the present disclosure is not limited thereto, and the correction value HVtbl[#j] may be changed in one burst output. For example, the correction value HVtbl[#j] may be calculated using values obtained by multiplying the correction amounts ΔHV #j, ΔHVc #j by a function of time.

6.2 Effect

(16) According to the fifth embodiment, the average value En #1avg of the pulse energy En[#1] of the pulses having the pulse number j in the wavelength change period being 1, the average value En #2avg of the pulse energy En[#2] of the pulses having the pulse number j in the wavelength change period being 2, and the average value Enavg of the pulse energy En[ ] are calculated. The correction data is calculated using the difference ΔEn #1 between the average value En #1avg and the average value Enavg and the difference ΔEn #2 between the average value En #2avg and the average value Enavg.

Accordingly, since the correction data corresponding to the phase shift between the switching of the target wavelengths λ1 and λ2 and the fluctuation of the pulse energy En is calculated, the pulse energy En can be further stabilized.

(17) According to the fifth embodiment, the correction value HVtbl[#j] is calculated for each pulse number j in the wavelength change period when the pulse laser light is output in the period in which the first burst output is performed.

Accordingly, the correction data including the correction value HVtbl[#j] can be calculated at high speed.

(18) According to the fifth embodiment, the average value HVc #1avg of the voltage command value HVc[#1] when the pulse number j in the wavelength change period is 1, the average value HVc #2avg of the voltage command value HVc[#2] when the pulse number j is 2, and the average value HVcavg of the voltage command value HVc[ ] are calculated. The correction data is calculated using the difference ΔHVc #1 between the average value HVc #1avg and the average value HVcavg and the difference ΔHVc #2 between the average value HVc #2avg and the average value HVcavg.

Accordingly, since the correction data corresponding to the phase shift between the switching of the target wavelengths λ1 and λ2 and the change of the voltage command value HVc is calculated, the pulse energy En can be further stabilized.

In other respects, the fifth embodiment is similar to the second embodiment.

7. Laser Device in which Voltage Command Value HVc is Set Based on Target Pulse Energy Et
7.1 Control by Laser Control Processor 130

Figure 24:
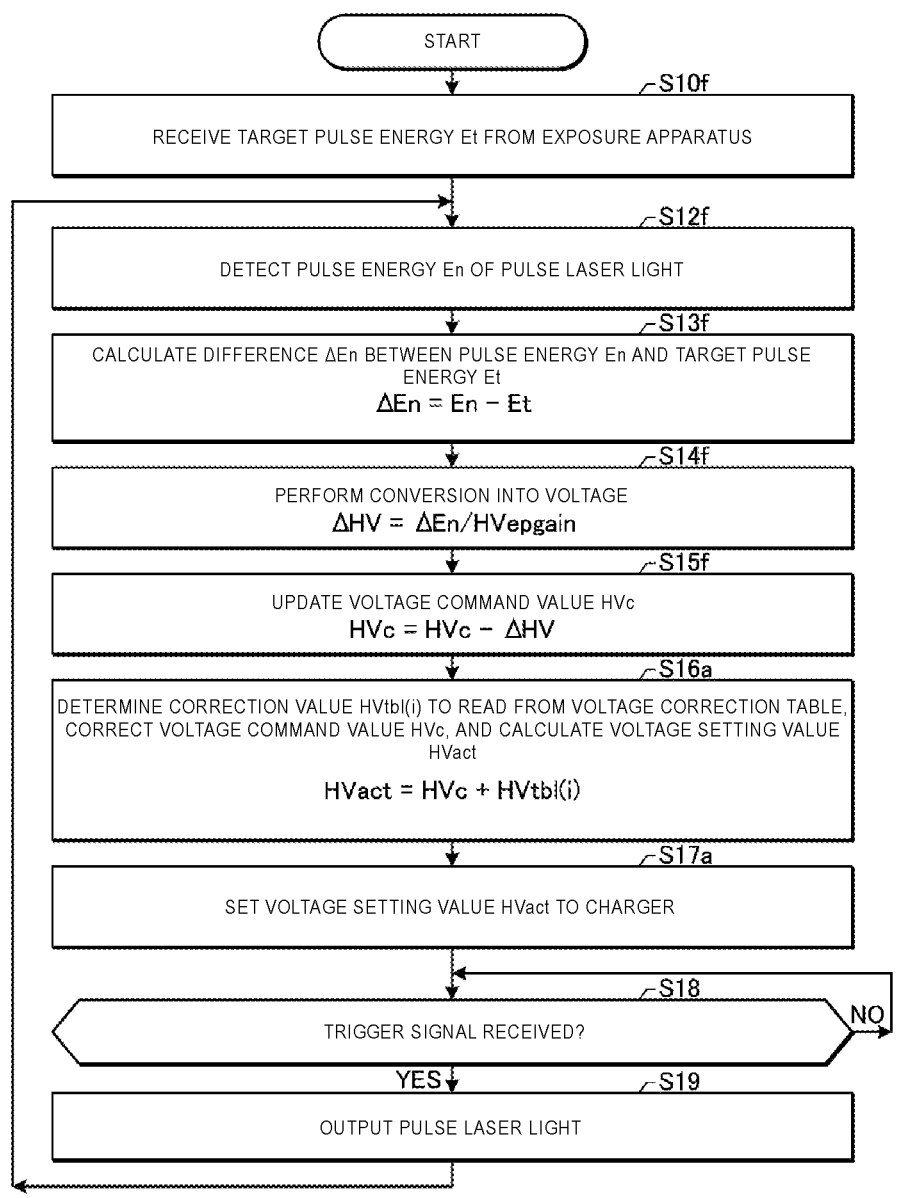
FIG. 24 is a flowchart showing processing performed by the laser control processor for outputting the pulse laser light in a sixth embodiment.

FIG. 24 is a flowchart showing processing performed by the laser control processor 130 for outputting the pulse laser light in a sixth embodiment. In the sixth embodiment, the laser control processor 130 acquires the voltage command value HVc by calculating the voltage command value HVc based on the target pulse energy Et received from the exposure control processor 210 as follows.

The configuration of the sixth embodiment may be similar to that of the first embodiment. However, the monitor module 17 measures not only the wavelength of the pulse laser light but also the pulse energy En.

In S10f, the laser control processor 130 receives the target pulse energy Et from the exposure control processor 210. The target pulse energy Et may not be received on a per-pulse basis, and may be received on a per-burst-output basis, for example.

In S12f, the laser control processor 130 detects the pulse energy En of the pulse laser light through the monitor module 17.

In S13f, the laser control processor 130 calculates the difference ΔEn between the detected pulse energy En and the target pulse energy Et by the following equation.

$$\Delta En = En - Et$$

In S14f, the laser control processor 130 converts the difference ΔEn into the voltage correction amount ΔHV by the following equation.

$$\Delta HV = \Delta En / HVep\text{gain}$$

In S15f, the laser control processor 130 updates the voltage command value HVc by the following equation.

$$HVc = HVc - \Delta HV$$

For example, when the pulse energy En detected in S12f is smaller than the target pulse energy Et, the difference ΔEn and the correction amount ΔHV become negative values in S13f and S14f. Since the absolute value of the voltage command value HVc which is a positive value increases in S15f, the pulse energy En of the subsequent pulse increases.

The processes from S16a to S19 are similar to those described with reference to FIG. 12. After S19, the laser control processor 130 returns processing to S12f.

7.2 Control by Exposure Control Processor 210

Figure 25:
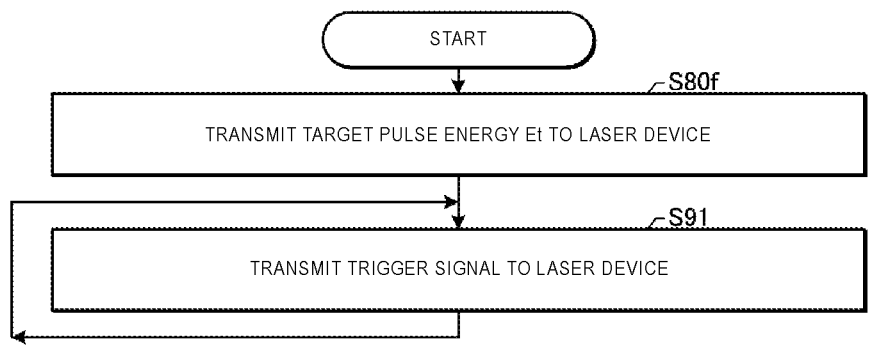
FIG. 25 is a flowchart showing processing of laser control performed by the exposure control processor in the sixth embodiment.

FIG. 25 is a flowchart showing processing of laser control performed by the exposure control processor 210 in the sixth embodiment. The exposure control processor 210 does not determine the voltage command value HVc.

In S80f, the exposure control processor 210 transmits the target pulse energy Et to the laser control processor 130 of the laser device 100a. The target pulse energy Et may not be transmitted on a per-pulse basis, and may be transmitted on a per-burst-output basis, for example.

The process of S91 is similar to that described with reference to FIG. 7. The exposure control processor 210 causes the laser device 100a to output the pulse laser light by repeating the process of S91.

In other respects, the sixth embodiment is similar to the first to fifth embodiments.

8. Others
8.1 Configuration of Monitor Module 17

Figure 26:
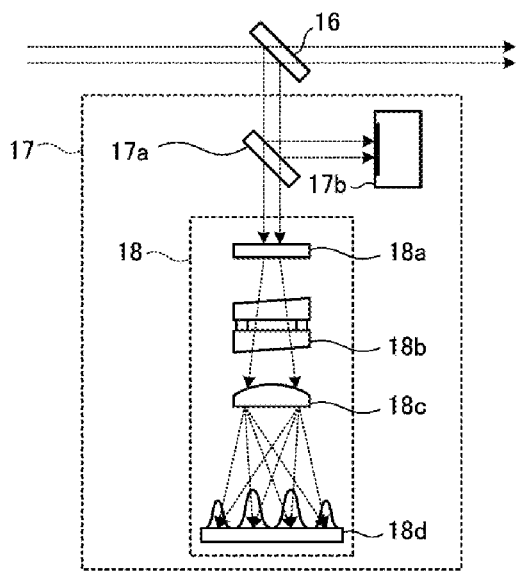
FIG. 26 schematically shows the configuration of a monitor module used in the comparative example and the first to sixth embodiments.

FIG. 26 schematically shows the configuration of the monitor module 17 used in the comparative example and the first to sixth embodiments. The monitor module 17 includes a beam splitter 17a, an energy sensor 17b, and an etalon spectrometer 18.

The beam splitter 17a is located on the optical path of the pulse laser light reflected by the beam splitter 16. The energy sensor 17b is located on the optical path of the pulse laser light reflected by the beam splitter 17a.

The etalon spectrometer 18 is arranged on the optical path of the pulse laser light transmitted through the beam splitter 17*a*. The etalon spectrometer 18 includes a diffusion plate 18*a*, an etalon 18*b*, a light concentrating lens 18*c*, and a line sensor 18*d*.

The diffusion plate 18*a* is located on the optical path of the pulse laser light transmitted through the beam splitter 17*a*. The diffusion plate 18*a* has a plurality of irregularities on the surface thereof and is configured to transmit and diffuse the pulse laser light.

The etalon 18*b* is located on the optical path of the pulse laser light transmitted through the diffusion plate 18*a*. The etalon 18*b* includes two partial reflection mirrors. The two partial reflection mirrors face each other with an air gap of a predetermined distance therebetween, and are bonded to each other with a spacer interposed therebetween.

The light concentrating lens 18*c* is located on the optical path of the pulse laser light transmitted through the etalon 18*b*.

The line sensor 18*d* is located on the optical path of the pulse laser light transmitted through the light concentrating lens 18*c* and on the focal plane of the light concentrating lens 18*c*. The line sensor 18*d* receives interference fringes formed by the etalon 18*b* and the light concentrating lens 18*c*. The interference fringes form an interference pattern of the pulse laser light, and have a concentric shape, and a square of a distance from the center of the concentric circles is proportional to a change in wavelength.

The line sensor 18*d* is a light distribution sensor including a large number of light receiving elements arranged in one dimension. Alternatively, instead of the line sensor 18*d*, an image sensor including a large number of light receiving elements arranged in two dimensions may be used as the light distribution sensor. Each of the light receiving elements is referred to as a channel. The light intensity distribution of the interference fringes is obtained from the light intensities detected at the respective channels.

8.2 Operation of Monitor Module 17

The energy sensor 17*b* detects the pulse energy En of the pulse laser light and outputs the data of the pulse energy to the laser control processor 130. The data of the pulse energy En may be used by the laser control processor 130 to perform feedback control on the voltage command value HVc in the sixth embodiment. The timing at which the data of the pulse energy En is received can be used as a reference for the timing at which the laser control processor 130 outputs a data output trigger to the etalon spectrometer 18.

The etalon spectrometer 18 generates a measurement waveform from the interference pattern of the pulse laser light detected by the line sensor 18*d*. The etalon spectrometer 18 transmits the measurement waveform to the laser control processor 130 in accordance with the data output trigger output from the laser control processor 130.

The measurement waveform is also referred to as a fringe waveform, and shows the relationship between the light intensity and the distance from the center of the concentric circles constituting the interference fringes.

The laser control processor 130 calculates, as the measurement wavelength, the center wavelength of the pulse laser light by using the measurement waveform output from the etalon spectrometer 18. Alternatively, a controller (not shown) included in the etalon spectrometer 18 calculates the measurement wavelength and transmits the calculated measurement wavelength to the laser control processor 130. The laser control processor 130 outputs a control signal to a driver (not shown) of the rotation stages 143, 163 based on the target wavelengths λ1, λ2 and the measurement wavelength, thereby performing feedback control on the center wavelength of the pulse laser light.

8.3 Supplement

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. A control method of a discharge-excitation type laser device including a power source configured to control a pulse energy of pulse laser light comprising:
   during a first period, outputting the pulse laser light including a plurality of pulses from the discharge-excitation type laser device while periodically changing a wavelength;
   calculating correction data for correcting a voltage command value to be set to the power source in accordance with a change in the wavelength by using first time-series data of pulse energies of the plurality of pulses; and
   during a second period, acquiring the voltage command value, correcting the acquired voltage command value using the correction data, and outputting the pulse laser light from the discharge-excitation type laser device in accordance with the corrected voltage command value.

2. The control method according to claim 1,
   wherein the first period corresponds to a period in which a first burst output is performed and the second period corresponds to a period in which a second burst output subsequent to the first burst output is performed, and
   the correction data is calculated after end of the first period and before start of the second period.

3. The control method according to claim 1,
   wherein the correction data is stored in a table, and
   the voltage command value is corrected using the correction data read from the table.

4. The control method according to claim 1,
   wherein the correction data is calculated using an average value of the pulse energies of the plurality of pulses as a reference.

5. The control method according to claim 1,
   wherein a first average value of pulse energies of first wavelength pulses output in accordance with a first target wavelength among the plurality of pulses, a second average value of pulse energies of second wavelength pulses output in accordance with a second target wavelength among the plurality of pulses, and a third average value of the pulse energies of the plurality of pulses are calculated, and
   the correction data is calculated using a difference between the first average value and the third average value and a difference between the second average value and the third average value.

6. The control method according to claim 1,
wherein correction values included in the correction data are calculated for each target wavelength set in the first period.

7. The control method according to claim 1,
wherein the correction data is calculated further using second time-series data of a plurality of the voltage command values set in the first period.

8. The control method according to claim 7,
wherein the correction data is calculated using an average value of the plurality of voltage command values as a reference.

9. The control method according to claim 1,
wherein a fourth average value of the voltage command values, when a first target wavelength is set, among a plurality of the voltage command values set in the first period, a fifth average value of the voltage command values, when a second target wavelength is set, among the plurality of voltage command values, and a sixth average value of the plurality of voltage command values are calculated, and
the correction data is calculated further using a difference between the fourth average value and the sixth average value and a difference between the fifth average value and the sixth average value.

10. The control method according to claim 1,
wherein the correction data is calculated by extracting a frequency component selected from the first time-series data.

11. The control method according to claim 10,
wherein the selected frequency component is a frequency component corresponding to an inverse of a wavelength change period when the pulse laser light is output in the first period.

12. The control method according to claim 1,
wherein the correction data is calculated using data obtained by calculating spectrum data by performing Fourier transform on the first time-series data and performing inverse Fourier transform on a frequency component selected from the spectrum data.

13. The control method according to claim 1,
wherein a correction value included in the correction data is calculated for each pulse output in the first period.

14. The control method according to claim 1,
wherein the correction data is calculated by extracting a frequency component selected from second time-series data of a plurality of the voltage command values set in the first period.

15. The control method according to claim 1,
wherein the correction data is calculated further using data obtained by calculating spectrum data by performing Fourier transform on second time-series data of a plurality of the voltage command values set in the first period and performing inverse Fourier transform on a frequency component selected from the spectrum data.

16. The control method according to claim 1,
wherein a seventh average value of pulse energies of pulses having a pulse number in a wavelength change period being 1 among the plurality of pulses, an eighth average value of pulse energies of pulses having the pulse number in the wavelength change period being 2 among the plurality of pulses, and a ninth average value of pulse energies of the plurality of pulses are calculated, and the correction data is calculated using a difference between the seventh average value and the ninth average value and a difference between the eighth average value and the ninth average value.

17. The control method according to claim 1,
wherein a correction value included in the correction data is calculated for each pulse number in a wavelength change period when the pulse laser light is output in the first period.

18. The control method according to claim 1,
wherein a tenth average value of the voltage command values set for pulses having a pulse number in a wavelength change period being a first value among the plurality of voltage command values set in the first period, an eleventh average value of the voltage command values set for pulses having the pulse number in a wavelength change period being a second value among the plurality of voltage command values, and a twelfth average value of the plurality of voltage command values are calculated, and
the correction data is calculated further using a difference between the tenth average value and the twelfth average value and a difference between the eleventh average value and the twelfth average value.

19. A discharge-excitation type laser device comprising:
a power source configured to control a pulse energy of pulse laser light; and
a processor configured to control the power source,
the processor being configured, during a first period, to output the pulse laser light including a plurality of pulses from a discharge-excitation type laser device while periodically changing a wavelength, and calculate correction data for correcting a voltage command value to be set to the power source in accordance with a change in the wavelength by using first time-series data of pulse energies of the plurality of pulses, and during a second period, to acquire the voltage command value, correct the acquired voltage command value using the correction data, and output the pulse laser light from the discharge-excitation type laser device in accordance with the corrected voltage command value.

20. An electronic device manufacturing method, comprising:
generating pulse laser light using a discharge-excitation type laser device;
outputting the pulse laser light to an exposure apparatus; and
exposing a photosensitive substrate to the pulse laser light in the exposure apparatus to manufacture an electronic device,
the discharge-excitation type laser device including:
a power source configured to control a pulse energy of the pulse laser light; and
a processor configured to control the power source,
the processor being configured, during a first period, to output the pulse laser light including a plurality of pulses from a discharge-excitation type laser device while periodically changing a wavelength, and calculate correction data for correcting a voltage command value to be set to the power source in accordance with a change in the wavelength by using first time-series data of pulse energies of the plurality of pulses, and during a second period, to acquire the voltage command value, correct the acquired voltage command value using the correction data, and output the pulse laser light from the discharge-excitation type laser device in accordance with the corrected voltage command value.

\* \* \* \* \*